US008484600B2

(12) United States Patent
Nishio et al.

(10) Patent No.: US 8,484,600 B2
(45) Date of Patent: Jul. 9, 2013

(54) APPARATUS, DESIGN METHOD AND RECORDING MEDIUM

(75) Inventors: Yoshitaka Nishio, Kawasaki (JP); Eiichi Konno, Kawasaki (JP); Kazunori Kumagai, Kawasaki (JP); Motoyuki Tanisho, Kawasaki (JP); Toshiyasu Sakata, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 2 days.

(21) Appl. No.: 13/221,572

(22) Filed: Aug. 30, 2011

(65) Prior Publication Data

US 2012/0117529 A1    May 10, 2012

(30) Foreign Application Priority Data

Nov. 9, 2010 (JP) ................................. 2010-251282

(51) Int. Cl.
*G06F 17/50* (2006.01)
(52) U.S. Cl.
USPC ............................ 716/126; 716/128; 716/132
(58) Field of Classification Search
None
See application file for complete search history.

(56) References Cited

U.S. PATENT DOCUMENTS

| | | | | |
|---|---|---|---|---|
| 5,757,656 A * | 5/1998 | Hershberger et al. | ......... | 716/129 |
| 6,473,885 B1 * | 10/2002 | Wallace | ................. | 716/107 |
| 6,477,688 B1 * | 11/2002 | Wallace | ................. | 716/107 |
| 6,584,608 B1 * | 6/2003 | Kumada et al. | ............... | 716/129 |
| 6,877,040 B1 * | 4/2005 | Nam et al. | .................... | 709/238 |
| 6,988,253 B1 * | 1/2006 | Lipton et al. | .................. | 716/112 |
| 7,039,881 B2 * | 5/2006 | Regan | ............................ | 716/103 |
| 7,249,340 B2 * | 7/2007 | Cooke et al. | .................. | 716/121 |
| 7,299,444 B1 * | 11/2007 | Tai et al. | ....................... | 716/117 |
| 7,809,864 B1 * | 10/2010 | Young et al. | .................... | 710/36 |
| 7,831,943 B1 * | 11/2010 | Das | ................ | 716/106 |
| 7,831,944 B2 * | 11/2010 | Kato et al. | .................... | 716/106 |
| 8,069,431 B1 * | 11/2011 | Zhang | .......................... | 716/128 |

FOREIGN PATENT DOCUMENTS

JP        09-044538 A    2/1997

OTHER PUBLICATIONS

Yan et al., "Routability-Driven RDL Routing with Pin Reassignment," Sep. 27-29, 2010 IEEE Int'l SOC Conference, pp. 133-138.*

* cited by examiner

*Primary Examiner* — Leigh Garbowski
(74) *Attorney, Agent, or Firm* — Fujitsu Patent Center

(57) ABSTRACT

A computer-readable medium storing a design program causing a computer to execute a process is provided. The process includes virtually routing, when routing of a wire to be connected between a first component and a second component at least one of which includes a swapping pin is being designed, the wire to be connected between a first pin of the first component and a first counterpart pin of the second component such that implementation of an actual routed wire connected therebetween is secured regardless of a net allocated to the swapping pin, and swapping one of the virtually routed first pin and the virtually routed first counterpart pin with the swapping pin such that the net allocated to the swapping pin is identical to a net allocated to the other one of the virtually routed first pin and the virtually routed first counterpart pin.

19 Claims, 35 Drawing Sheets

※ NUMERALS INDICATE NET NUMBERS

FIXED — 1    2 — SWAPPED

SWAPPED — 1    2 — SWAPPED

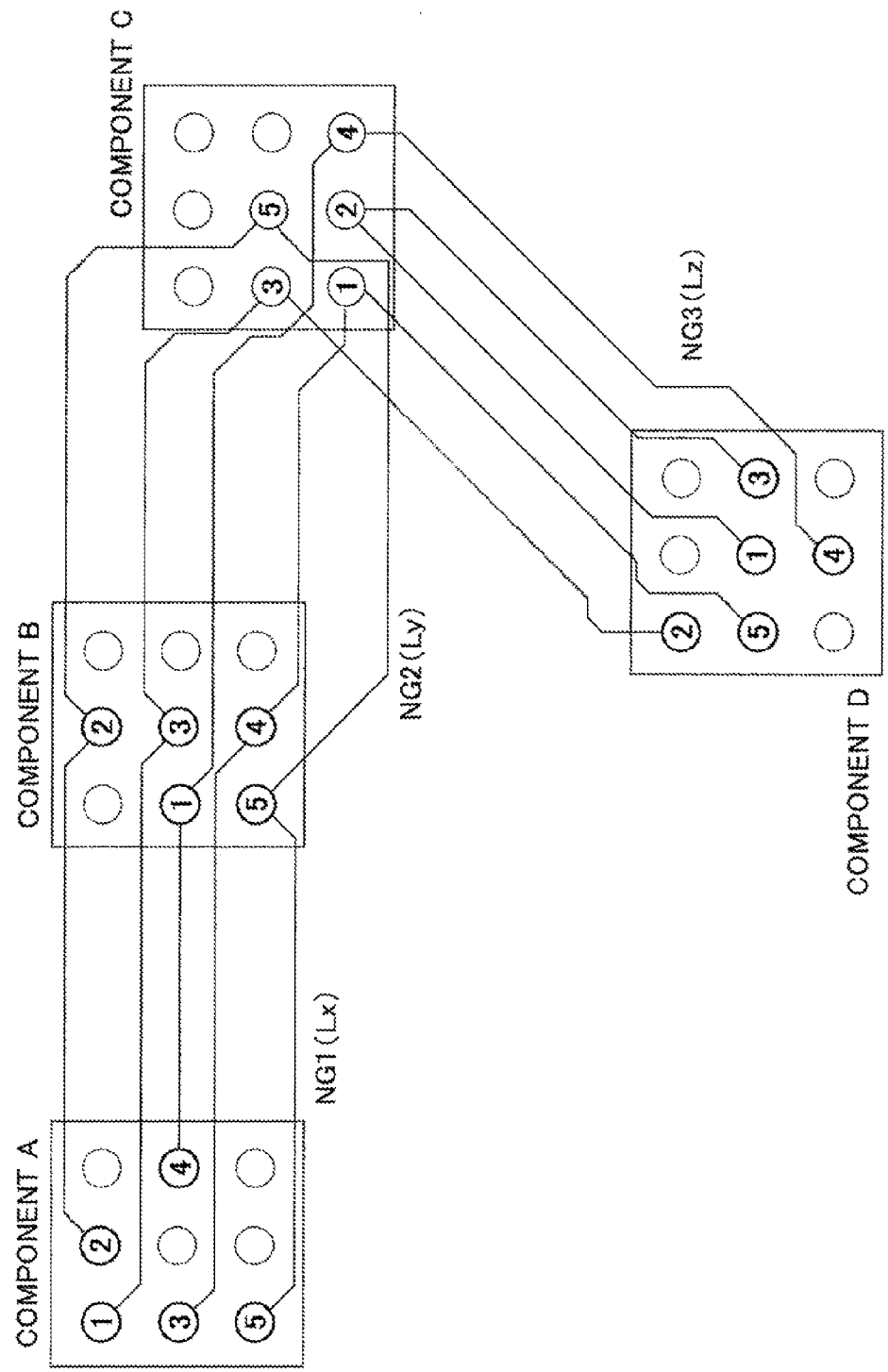

※ NUMERALS INDICATE NET NUMBERS

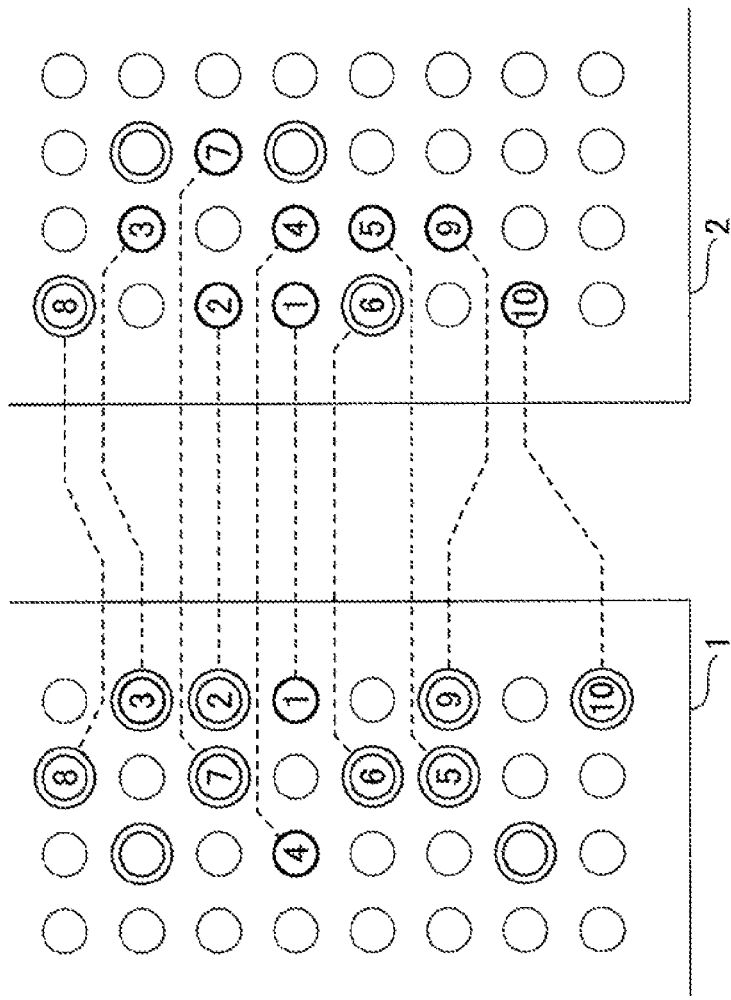
FIG.15C
 SWAPPED PINS

※ NUMERALS INDICATE NET NUMBERS

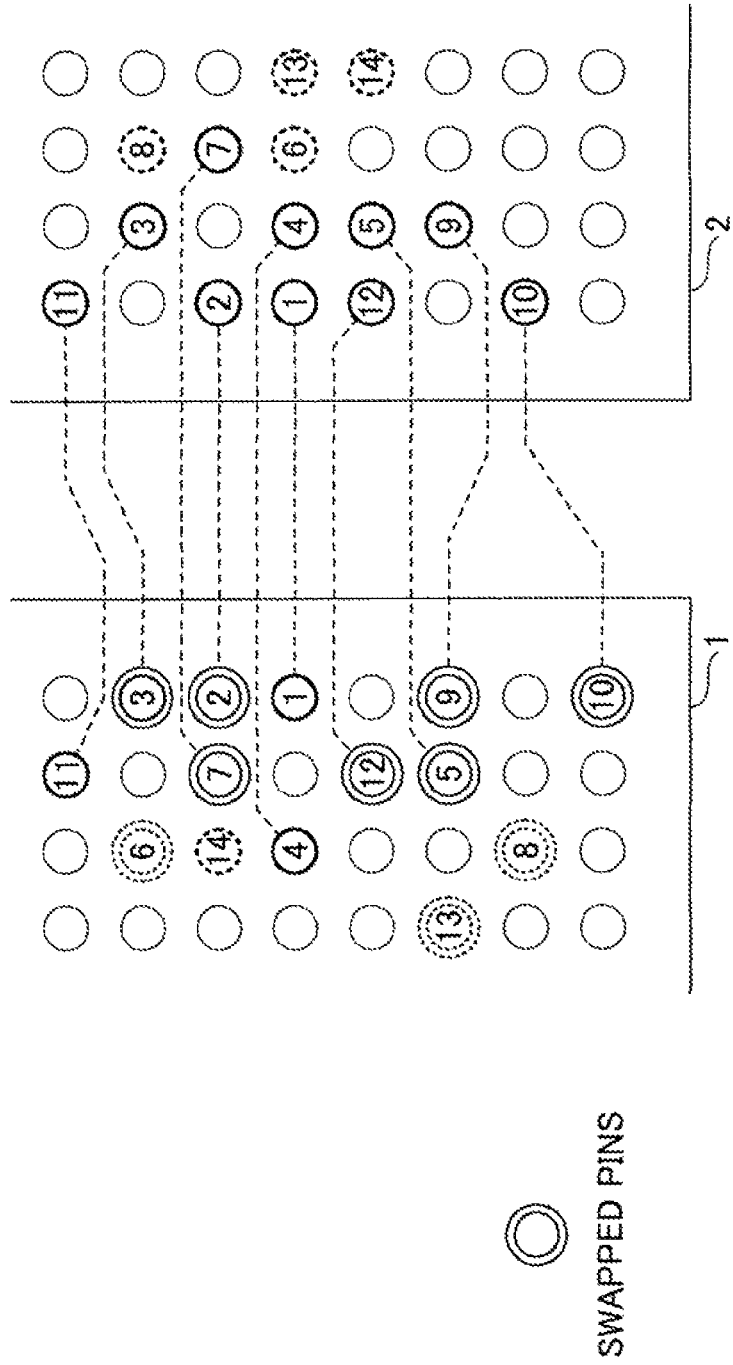

※ NUMERALS INDICATE NET NUMBERS

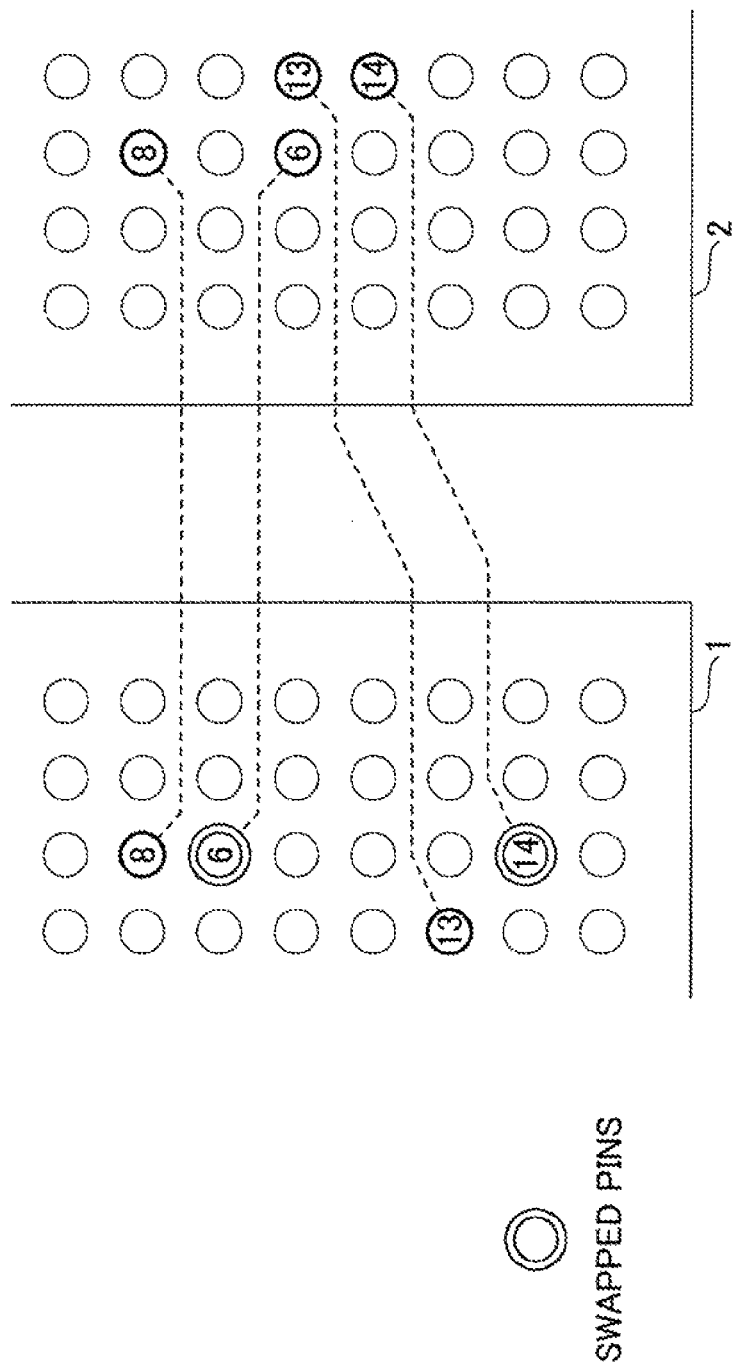

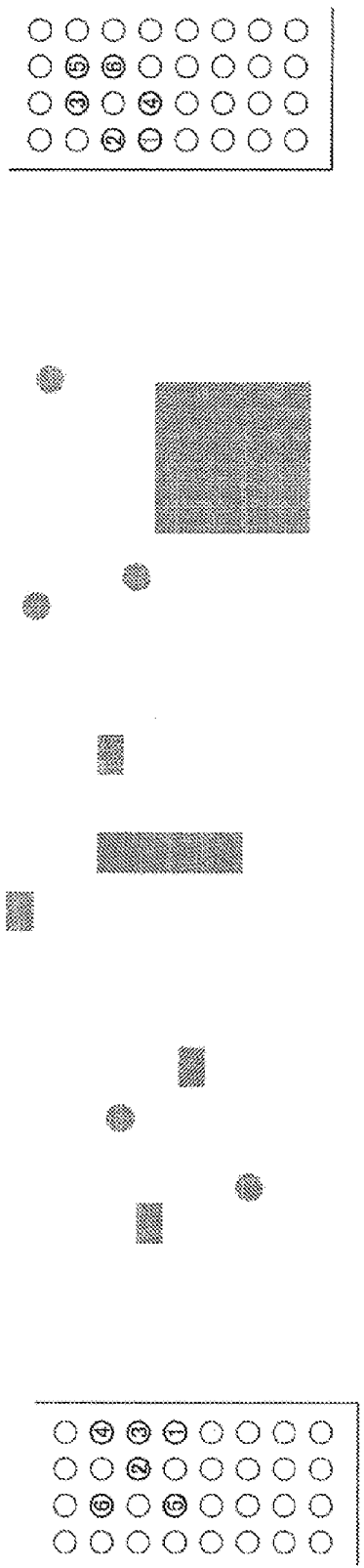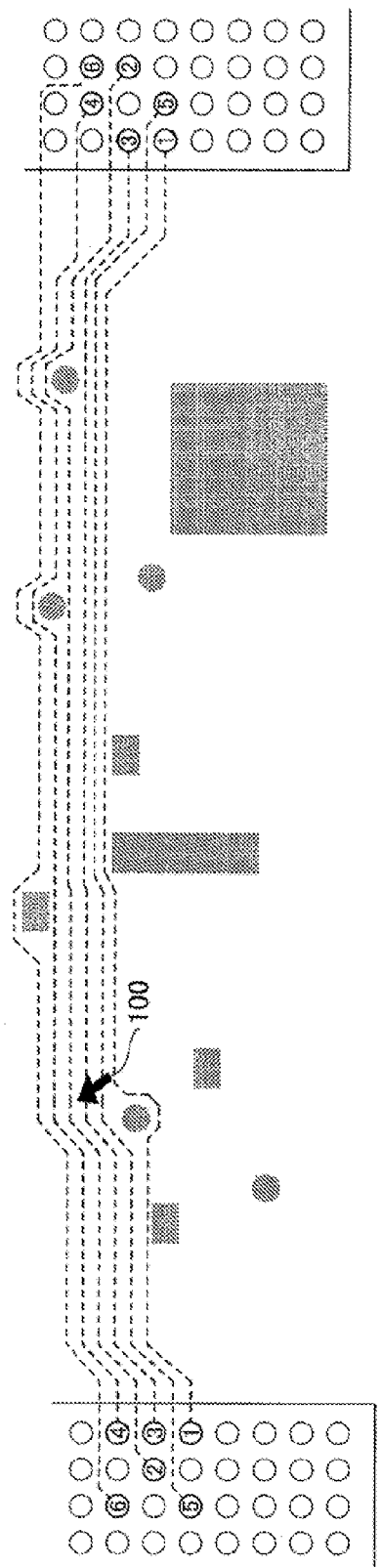

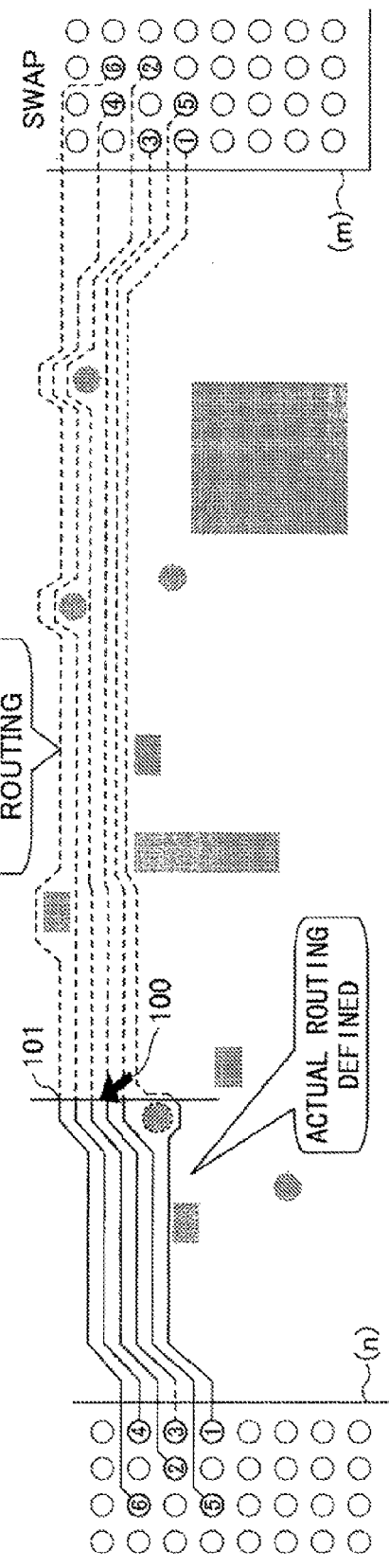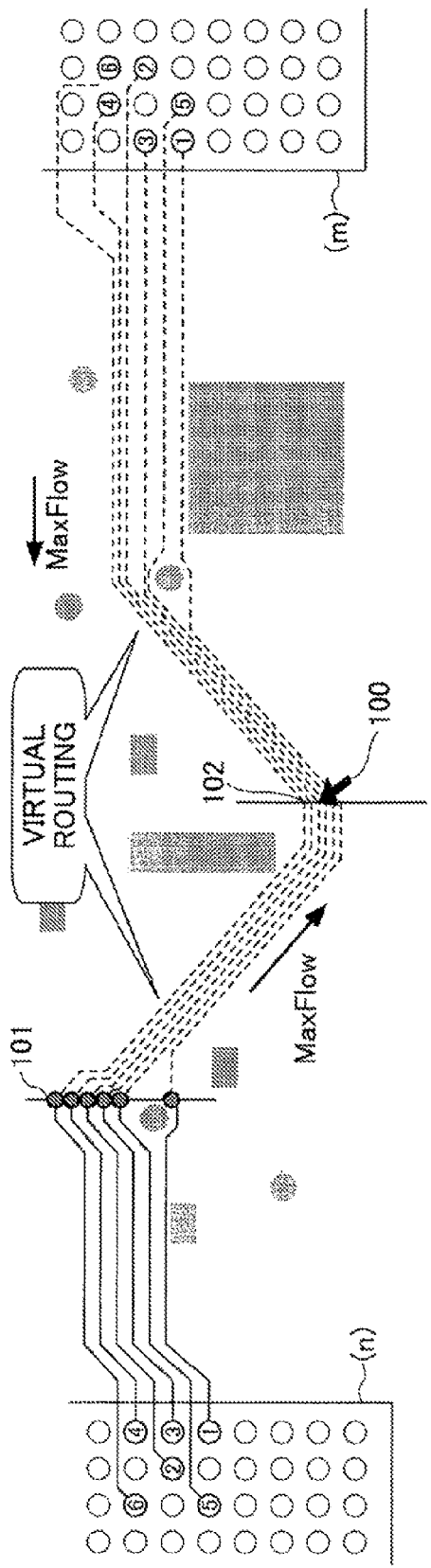

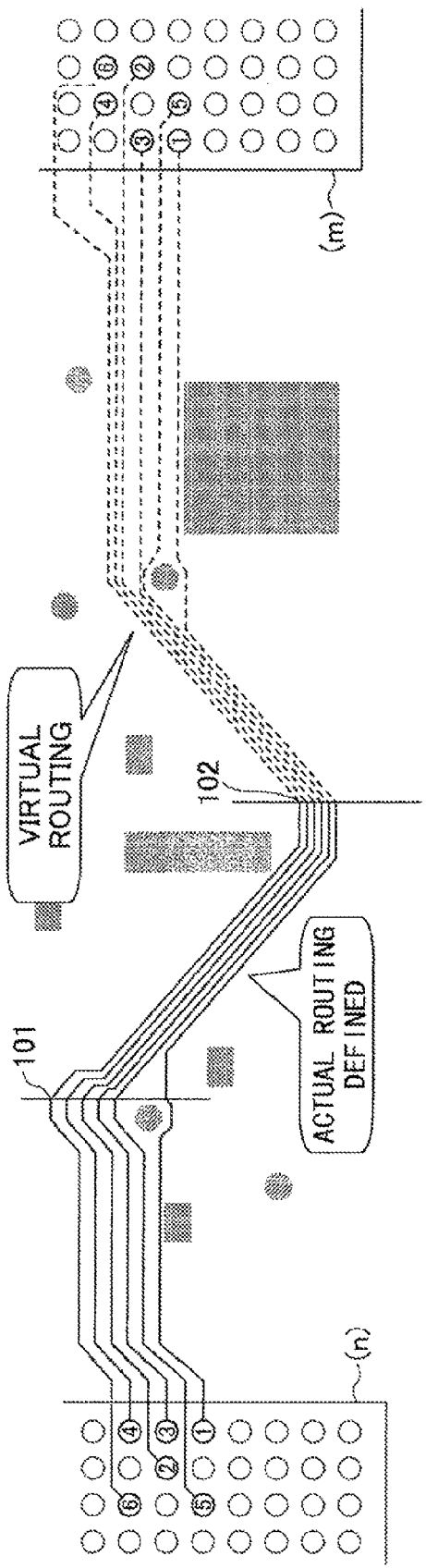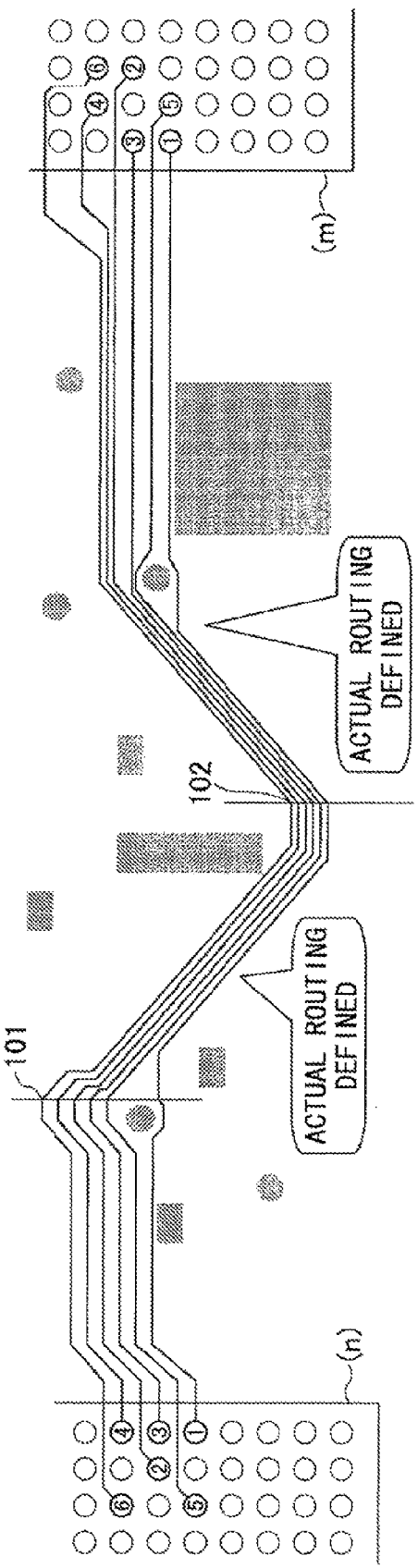

APPARATUS, DESIGN METHOD AND RECORDING MEDIUM

CROSS-REFERENCE TO RELATED APPLICATIONS

This patent application is based upon and claims the benefit of priority of the prior Japanese Patent Application No. 2010-251282 filed on Nov. 9, 2010, the entire contents of which are incorporated herein by reference.

FIELD

A certain aspect of the embodiment discussed herein is related to a design method, a design apparatus and a computer-readable recording medium storing a design program.

BACKGROUND

A computer aided design (CAD) technology has been utilized in various types of design processes. An example of the CAD includes an electric CAD that may include a printed circuit board (PCB) CAD (mounting CAD) configured to place components of the PCB and route wires between the components. Designers of the PCB, for example, may place the components of the PCB and route the wires of the PCB by utilizing the PCB CAD.

In the PCB, a field-programmable gate array (FPGA) that is a component including swappable pins may be utilized. Examples of swapping of the pins are illustrated in FIGS. 1 and 2.

FIG. 1 is a conceptual diagram illustrating an example of a tangled rat's nest. The rat's nest indicates connecting lines between nodes. The rat's nest represents a logical connection relationship between the nodes. FIG. 1 illustrates the tangled rat's nest representing the connections between the pins of a component 1 and the pins of another component (not illustrated). For example, some of the pins may be swapped with corresponding pins to minimize tangles of the rat's nest in FIG. 1. FIG. 2 is a conceptual diagram illustrating an example of a rat's nest in which the tangles are minimized after some of the pins are swapped with the corresponding pins.

For example, since the FPGA that is an example of the component including swappable pins includes the increased number of pins and plural I/O banks, the high-speed and high-density FPGA may be achieved. Accordingly, it may be difficult to manually allocate I/O pins to minimize the tangles of the rat's nest.

In an example of the related art routing processing apparatus, if crossing (i.e., tangle) of a net is avoidable by replacing a specific node with a node equivalent to the specific node (hereinafter called an equivalent node), the specific node is replaced with the equivalent node in advance and then conductor patterns are routed on the PCB. Another example of the related art discloses a routing processing system that may improve operability of the routing processing system by reducing manual operations involving replacement of a certain node with an equivalent node or routing of conductor patterns (e.g., Japanese Laid-Open Patent Application Publication No. 9-44538).

SUMMARY

According to an aspect of the embodiment, there is provided a computer-readable medium storing a design program, which, when processed by a processor, causes a computer to execute a process. The process includes virtually routing, when routing of a wire to be connected between a first component and a second component at least one of which includes a swapping pin is being designed, the wire to be connected between a first pin of the first component and a first counterpart pin of the second component such that implementation of an actual routed wire connected therebetween is secured regardless of a net allocated to the swapping pin; and swapping one of the virtually routed first pin and the virtually routed first counterpart pin with the swapping pin such that the net allocated to the swapping pin is identical to a net allocated to the other one of the virtually routed first pin and the virtually routed first counterpart pin.

The object and advantages of the invention will be realized and attained by means of the elements and combinations particularly pointed out in the appended claims. It is to be understood that both the foregoing general description and the following detailed description are exemplary and explanatory and are not restrictive of the invention as claimed.

Additional objects and advantages of the embodiment will be set forth in part in the description which follows, and in part will be obvious from the description, or may be learned by practice of the invention.

BRIEF DESCRIPTION OF THE DRAWINGS

FIGS. 10A to 10D are conceptual diagrams illustrating another example of the process carried out by the routing processing part in the design apparatus according to the embodiment;

FIGS. 15A to 15C are conceptual diagrams illustrating an example of a process carried out by the routing processing part in the design apparatus according to the embodiment;

FIGS. 16A to 16C are conceptual diagrams illustrating another example of the process carried out by the routing processing part in the design apparatus according to the embodiment;

FIGS. 17A to 17C are conceptual diagrams illustrating another example of the process carried out by the routing processing part in the design apparatus according to the embodiment;

FIGS. 25A and 25B are conceptual diagrams (2/2) illustrating another example of the process carried out by the routing processing part in the design apparatus according to the embodiment;

FIGS. 27A and 27B are conceptual diagrams (2/3) illustrating another applied example of the process carried out by the routing processing part in the design apparatus according to the embodiment; and FIGS. 28A and 28B are conceptual diagrams (3/3) illustrating another applied example of the process carried out by the routing processing part in the design apparatus according to the embodiment.

DESCRIPTION OF EMBODIMENT

Figure 1:
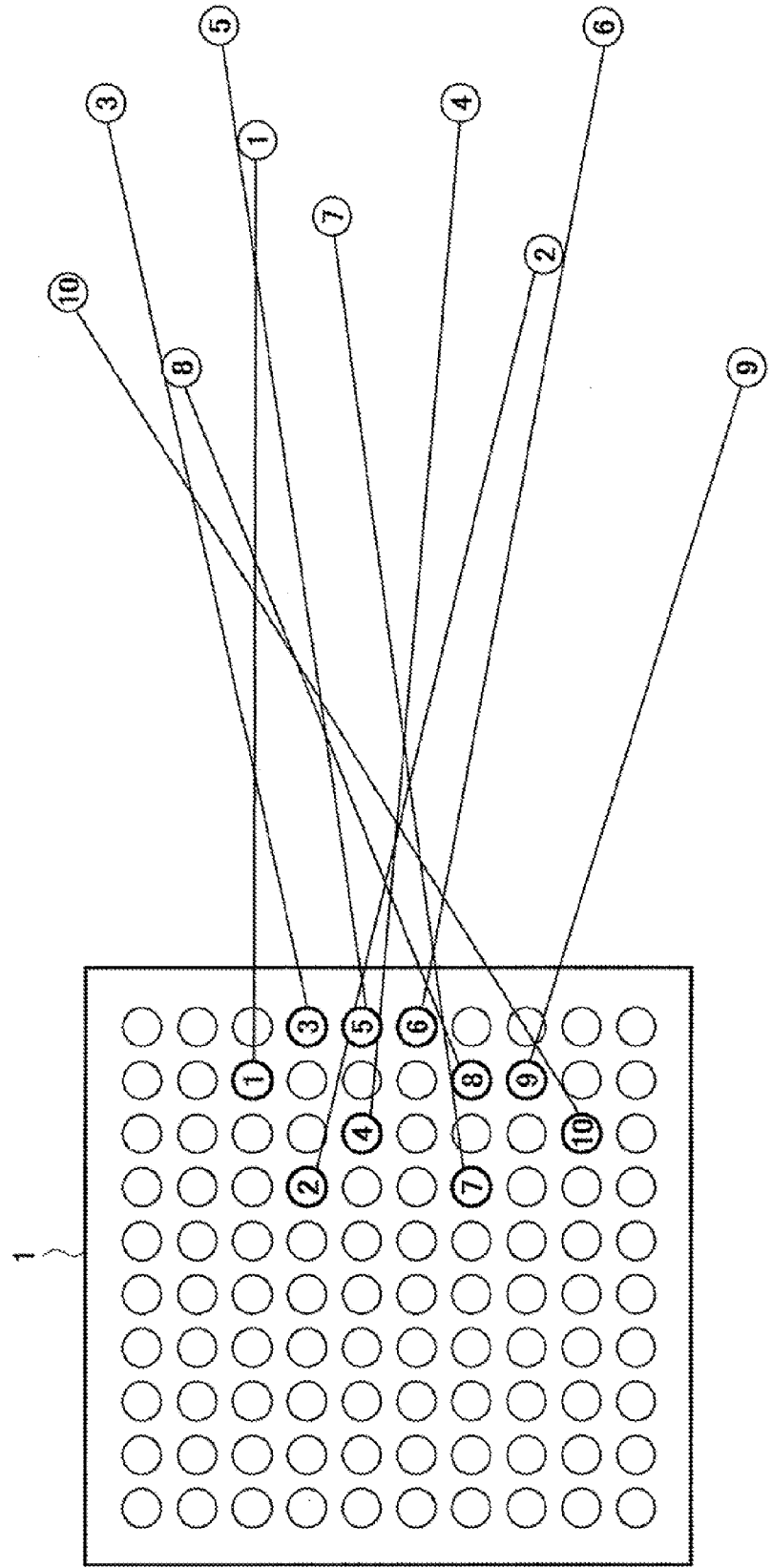
FIG. 1 is a conceptual diagram illustrating an example of a tangled rat's nest.
Figure 2:
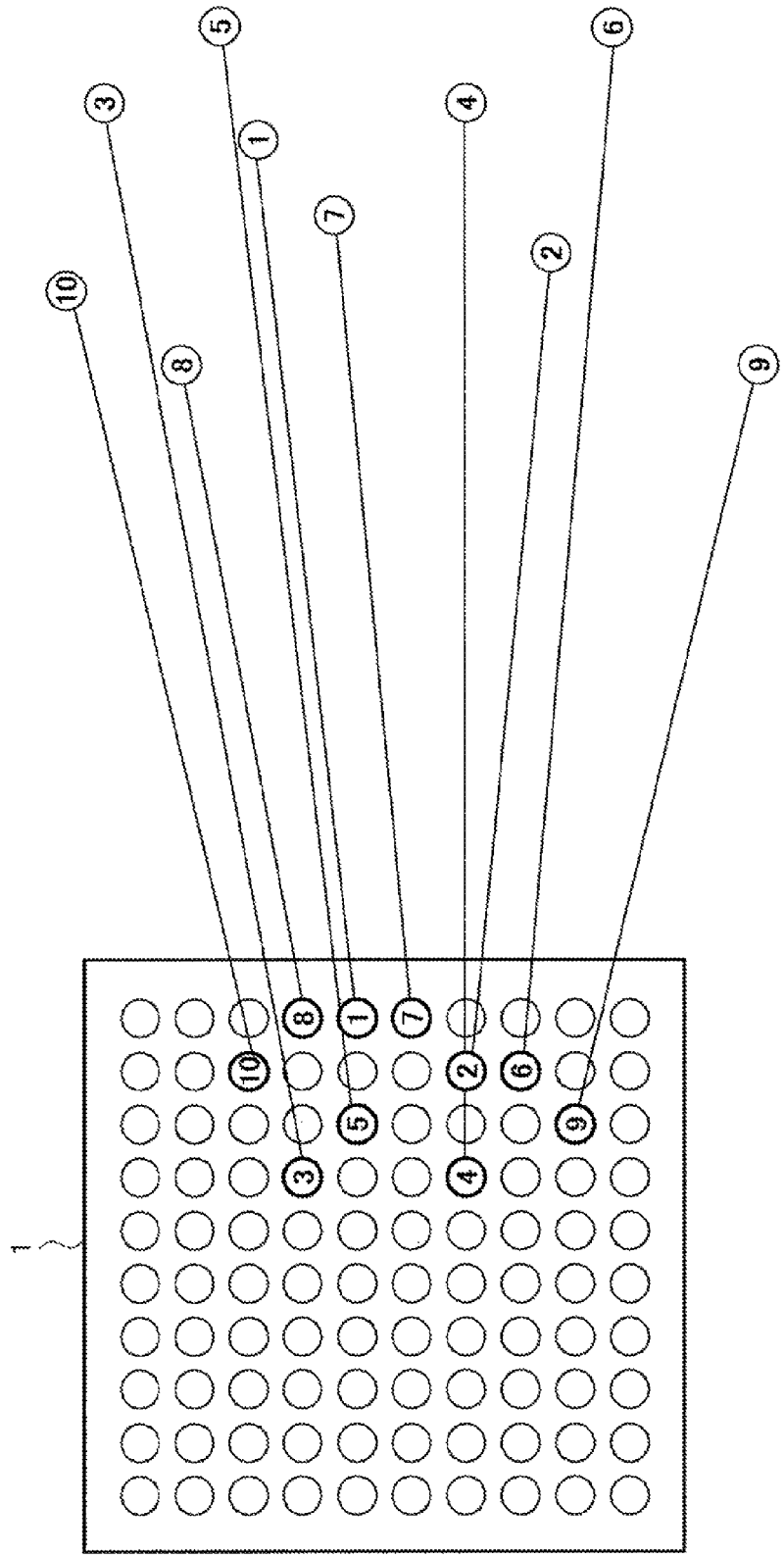
FIG. 2 is a conceptual diagram illustrating an example of a rat's nest including the minimum tangles after the pins are swapped.

Referring back to FIGS. 1 and 2, when the rat's nest is tangled and the tangle of the rat's nest is minimized by swapping pins, actual routing of the wires on the printed circuit board may still not satisfy physical or electric restrictions. If the actual routing of the wires on the printed circuit board (PCB) does not satisfy the physical or electric restrictions, the swapped pins may have to be cancelled and reallocated from the beginning in the related art PCB.

Particularly, a component including numerous swappable pins such as the FPGA has numerous combinations of swappable pins, and hence it may take a longtime to route wires of the swapped pins. Thus, repeating swapping of the pins and routing of the wires of the swapped pins may increase required labor.

Next, descriptions are given below, with reference to the accompanying drawings, of embodiment. The design method, the design apparatus and the computer-readable recording medium storing the design program utilized for a computer aided design (CAD) according to the embodiment disclosed herein are merely examples and may be other named methods, apparatuses, and programs stored in the computer-readable recording medium. Further, in the embodiment disclosed herein, the FPGA is illustrated as an example of the component having the swappable pins arranged on the PCB; however, the component may be a connector, an application specific integrated circuit (ASIC), and the like.

Figure 3:
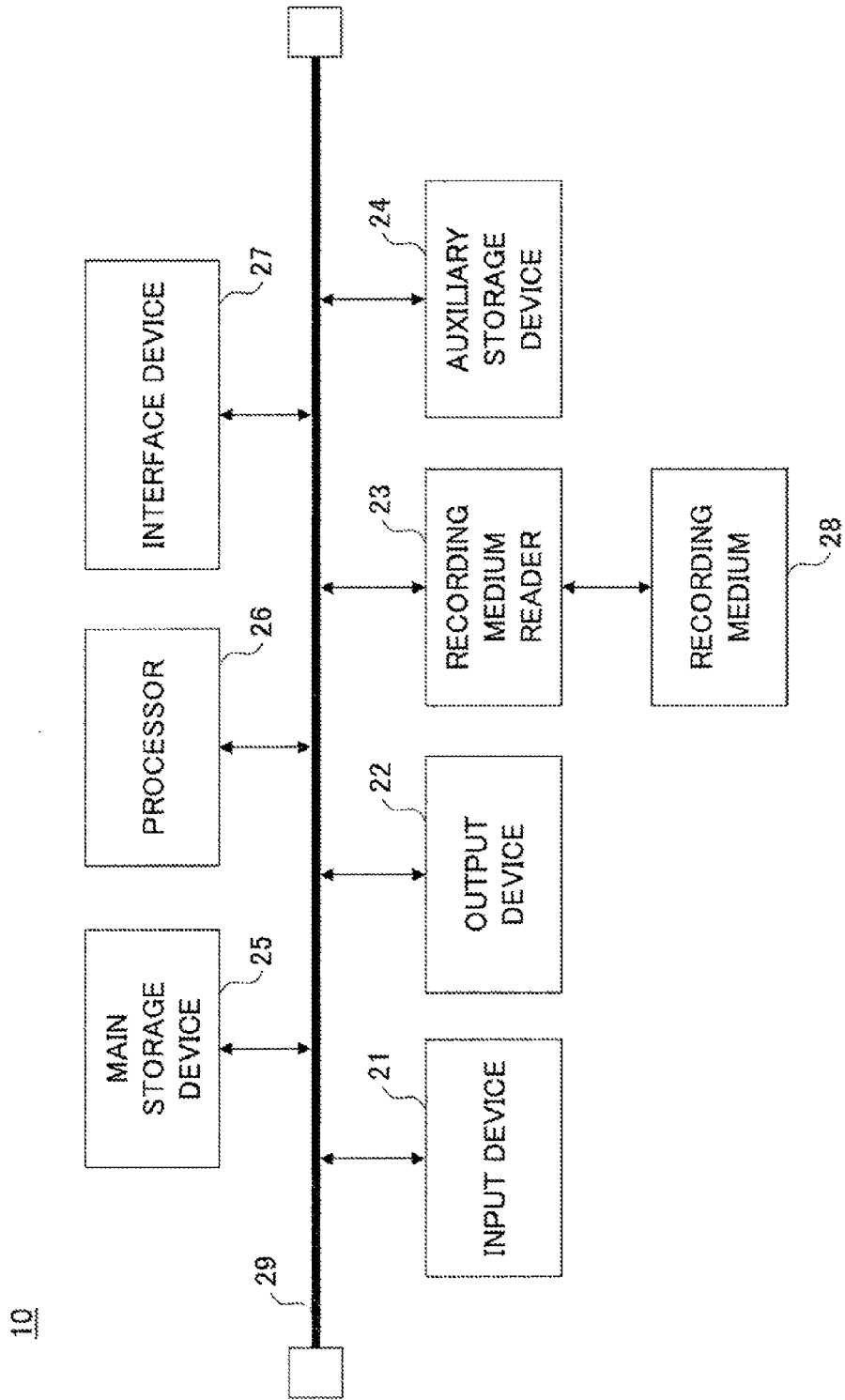
FIG. 3 is a hardware configuration diagram illustrating an example of a personal computer (PC)

The design program stored in the computer-readable recording medium according to an embodiment may be executed by a personal computer (PC) 10 illustrated in FIG. 3. FIG. 3 is a hardware configuration diagram illustrating an example of the PC. As illustrated in FIG. 3, the PC 10 includes an input device 21, an output device 22, a recording medium reader 23, an auxiliary storage device 24, a main storage device 25, a processor 26, and an interface device 27 that are connected to one another via a bus 29.

The input device 21 may be a keyboard, a mouse or the like. The input device 21 is utilized for inputting various signals. The output device 22 may be a display device or the like. The output device 22 is utilized for displaying various windows and data. The interface device 27 may be a modem, a LAN card or the like. The interface device 27 is utilized for connecting the various devices of the PC 10 on a network.

The design program stored in the computer-readable recording medium according to the embodiment may be at least part of various programs that control the PC 10 illustrated in FIG. 3. The design program may be distributed in the form of a recording medium 28 or may be downloaded via the network. Various types of recording media may be used as the recording medium 28 storing the design program illustrated in this embodiment. Examples of such recording media include a magneto-optical disk, that is, a recording medium on which information is optically and electrically, or magnetically recorded, a CD-ROM and a flexible disk, and a ROM or a flash memory, that is, a semiconductor memory on which information is electrically recorded.

When the recording medium 28 storing the design program is placed in the recording medium reader 23, the design program is installed in the auxiliary storage device 24 from the recording medium 28 via the recording medium reader 23.

The design program downloaded via the network is installed in the auxiliary storage device 24 via the interface device 27. The auxiliary storage device 24 stores necessary files, data and the like as well as storing the installed design program.

The main storage device 25 stores the design program retrieved from the auxiliary storage device 24 when starting up the design program. The processor 26 implements various types of processing that will be described later based on the design program stored in the main storage device 25. The PC 10 that executes the design program may be an example of the design apparatus.

Figure 4:
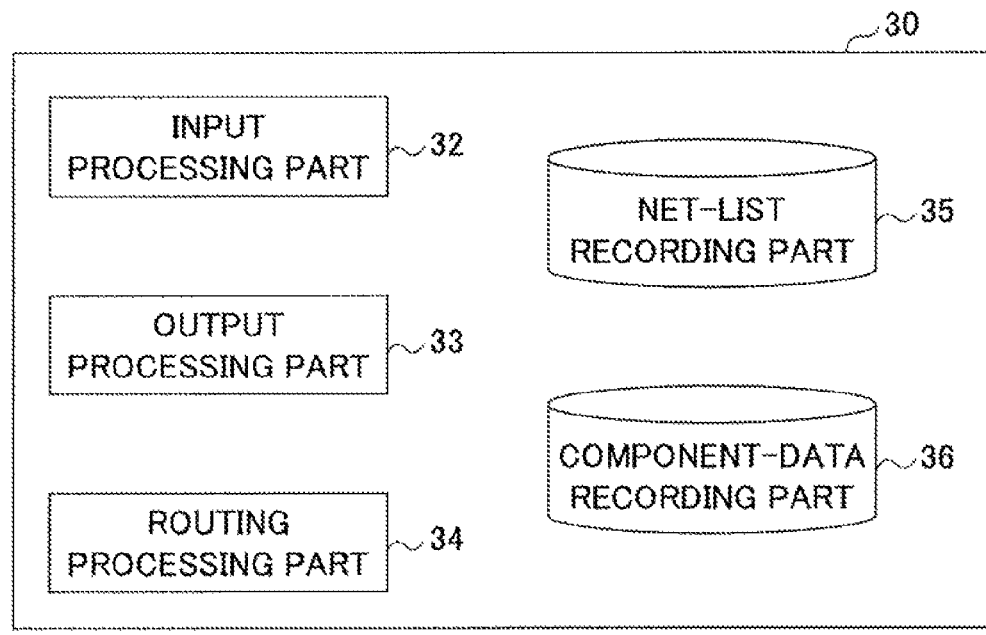
FIG. 4 is a block diagram illustrating a design apparatus according to an embodiment.

The processor 10, for example, implements various types of processing illustrated in FIG. 4 based on the design program stored in the main storage device 25. FIG. 4 is a block diagram illustrating a design apparatus 30 according to an embodiment.

The design apparatus 30 according to the embodiment includes an input processing part 32, an output processing part 33, a routing processing part 34, a net-list recording part 35 and a component-data recording part 36. The input processing part 32 carries out input processing based on the content input by a user such as a designer via the input device 21. The output processing part 33 carries out output processing based on the content input by the user or the result of the routing processing performed by the routing processing part 34. The routing processing part 34 retrieves a net list from the net-list recording part 35 and retrieves component data from the component-data recording part 36 to carry out the routing processing.

The net-list recording part 35 is configured to record the net list. The net list records later described net groups of component names and pin names of the components that are linked by corresponding net names. The component-data recording part 36 is configured to record component data. The component data includes pin names and swappable pin information for identifying swappable pins that are associated with the component names. Note that the swappable pin information includes corresponding swappable pin numbers described later.

Figure 5:
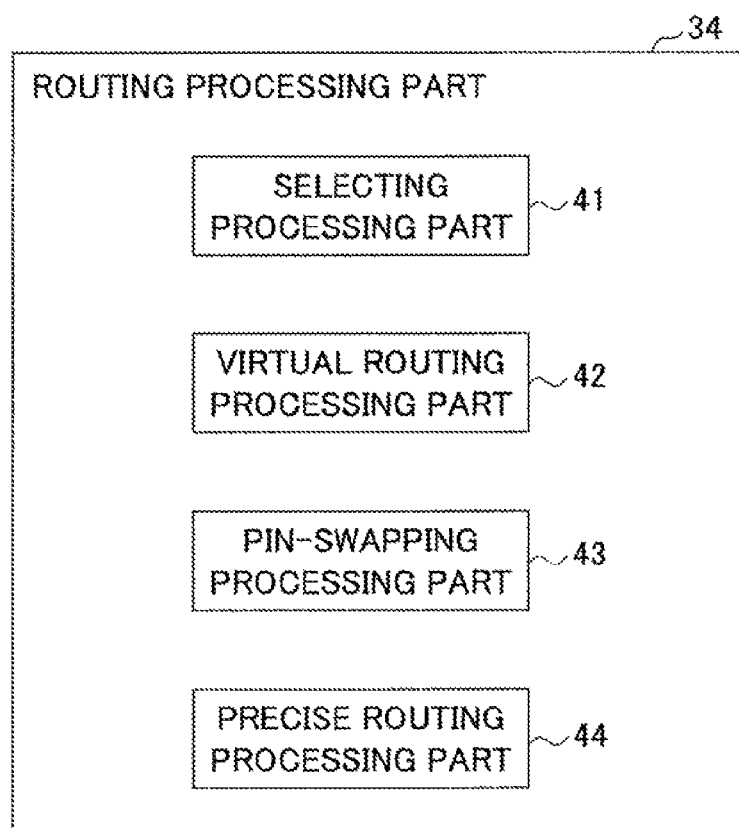
FIG. 5 is a circuit block diagram of a routing processing part arranged in the design apparatus according to the embodiment.

FIG. 5 is a block diagram illustrating an example of the routing processing part 34 arranged in the design apparatus according to the embodiment. As illustrated in FIG. 5, the routing processing part 34 includes a selecting processing part 41, a virtual routing processing part 42, a pin-swapping processing part 43 and a precise routing processing part 44.

The selecting processing part 41 is configured to select a target pin (via-hole) group subject to the routing processing. For example, the selecting processing part 41 selects a source pin group and the target pin group subject to the routing processing. The virtual routing processing part 42 is configured to virtually route wires of the selected source pins and target pins. The virtual routing processing part 42 may virtually route the wires of the selected source pins and target pins utilizing a single-layer wire-routing method such as a max-flow algorithm. That is, the virtual routing processing part 42 may connect plural nets allocated to the swappable pins to a specific single layer (L layer), which is an example of the single-layer wire-routing method. The max-flow algorithm is utilized as a method for actually routing the wires on the PCB to satisfy physical or electric restrictions. Note that a group of the nets per routing unit is called a "net group".

Thus, the single-layer wire-routing method utilized by the virtual routing processing part 42 virtually connects the wires between the source pins and target pins that the actual wires routed on the PCB satisfy physical or electric restrictions. The pin-swapping processing part 43 applies a later-described swapping pin method to some of the virtually wire-connected pins that include mismatched net names. The precise routing processing part 44 is configured to precisely route the wires that have been virtually connected the source pins and target pins.

Figure 6A:
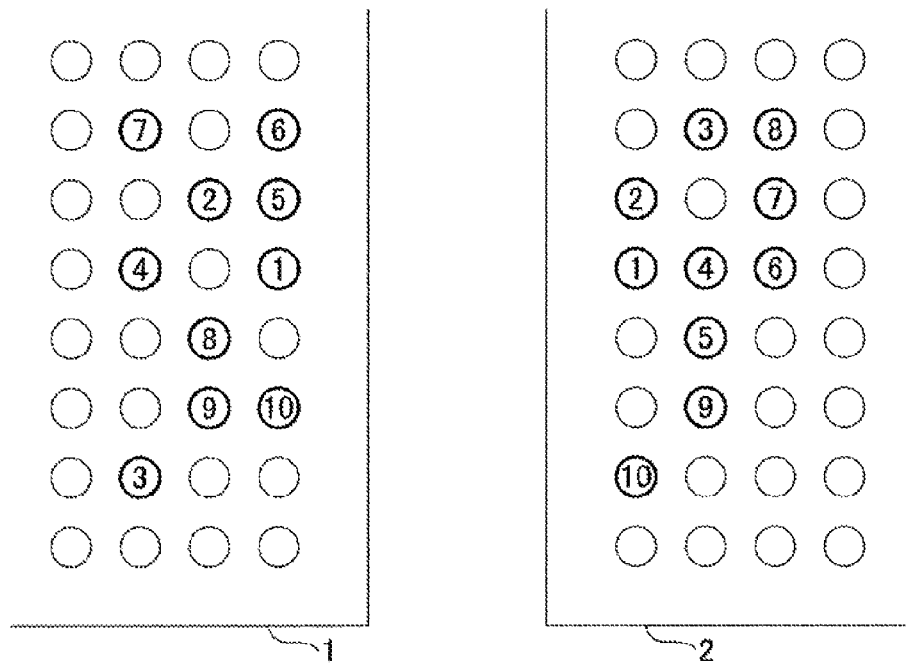
FIGS. 6A to 6C are conceptual diagrams illustrating an example of a process carried out by the routing processing part in the design apparatus according to the embodiment.
Figure 6B:
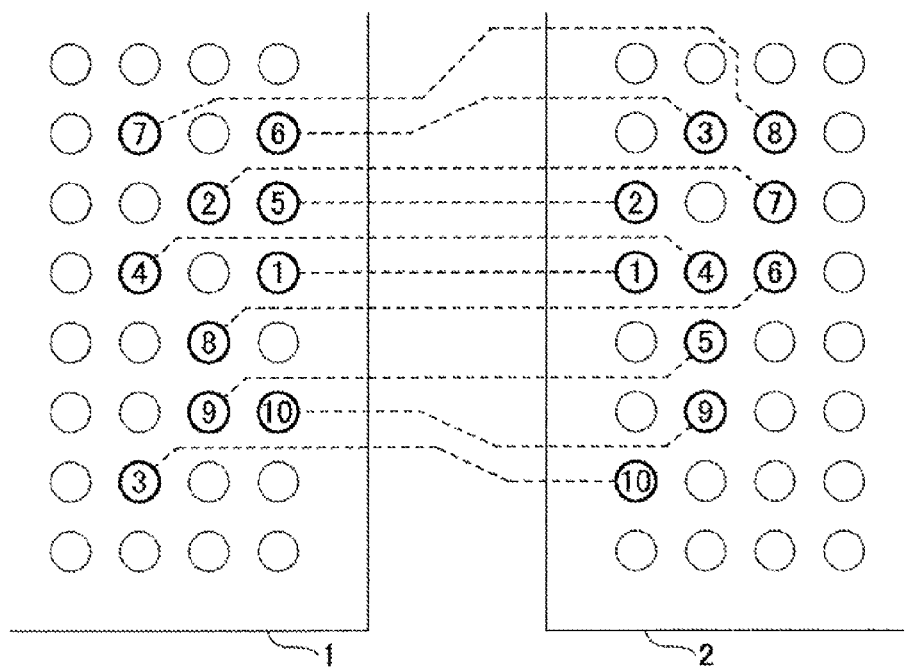
Figure 6C:
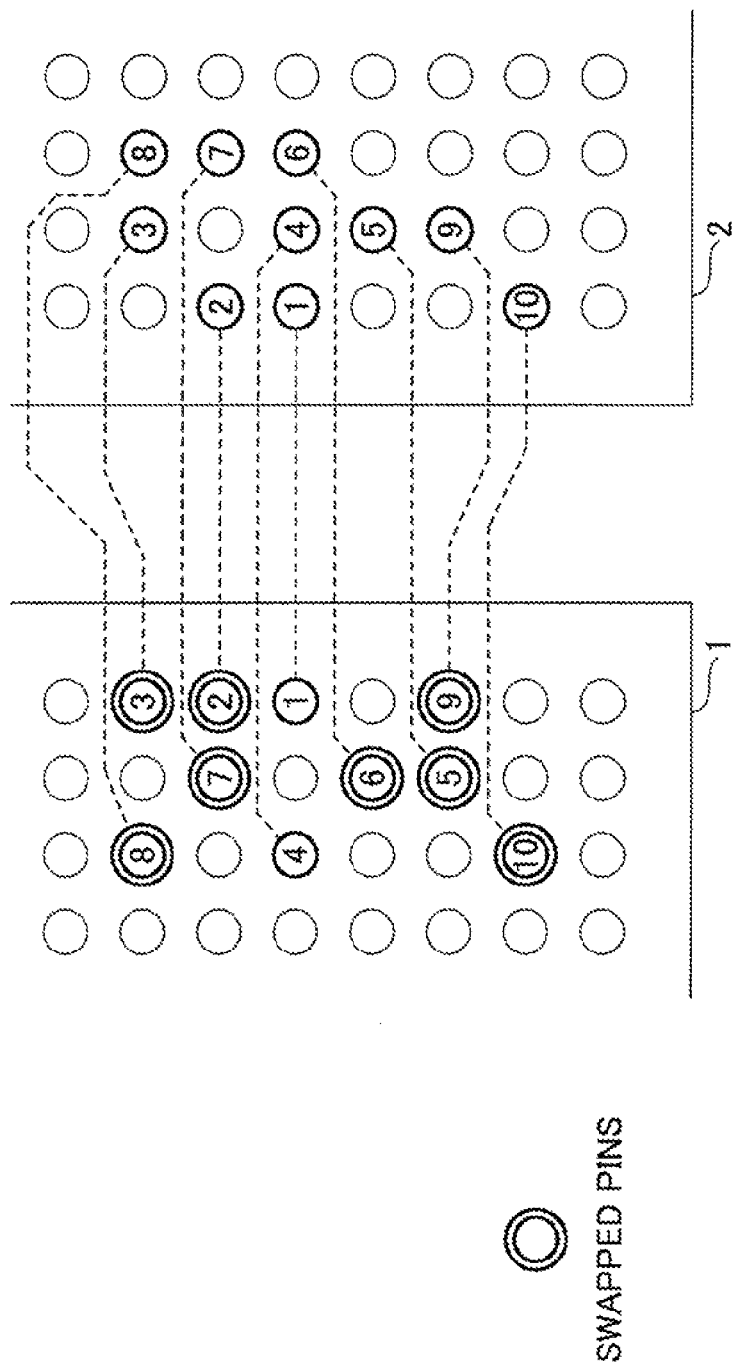

FIGS. 6A to 6C are conceptual diagrams illustrating an example of a process carried out by the routing processing part 34 in the design apparatus according to the embodiment. FIG. 6A illustrates net groups of pins corresponding to a component 1 and a component 2 connected in a single layer. Note that circles in FIG. 6A to FIG. 6C represent pins (via-holes). Encircled numerals in FIG. 6 represent net numbers, which are examples of the net names. The pins of the component 1 and the component 2 in FIG. 6A to FIG. 6C represent swappable pins.

In FIG. 6B, the pins of the component 1 and the component 2 illustrated in FIG. 6A are virtually wire-connected by utilizing the simple single-layer wire-routing method such as the max-flow algorithm that the actual wires routed on the PCB satisfy physical or electric restrictions. FIG. 6B illustrates a virtual wire connection of the pins of the component 1 and the component 2, in which the pins are virtually connected regardless of the net numbers of the respective pins.

In FIG. 6C, some of the virtually wire-connected pins in FIG. 6B having the mismatched net numbers are subject to the pin-swapping processing so that they are swapped with those having matched net numbers. Note that double circles in FIG. 6C represent the swapped pins. The pins of the component 1 are virtually connected to the pins of the component 2 regardless of the net numbers of the respective pins in the pin-swapping processing so that some of the pins of the component 1 and their counterpart pins of the component 2 include mismatched net numbers in FIG. 6B. However, after performing the pin-swapping processing, the virtually wire-connected pins of the component 1 and their counterpart pins of the component 2 in FIG. 6B have the same (matched) net numbers in FIG. 6C.

As described above, in the design apparatus 30 according to the embodiment, the virtual routing processing and the pin-swapping processing may be coordinated, and the pins may be automatically swapped after the wire-connecting of the pins is complete. Accordingly, the pins may be allocated while securing the implementation of the actual wire-connecting of the pins, which may minimize the cancellation and reallocation of the swapped pins.

Figure 7A:
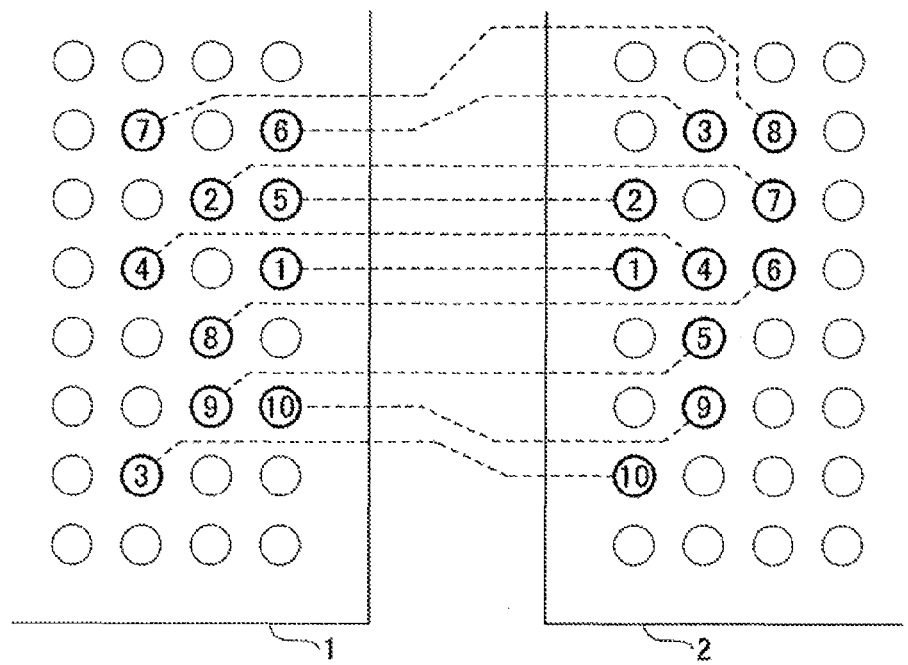
FIGS. 7A to 7C are conceptual diagrams illustrating another example of the process carried out by the routing processing part in the design apparatus according to the embodiment.
Figure 7B:
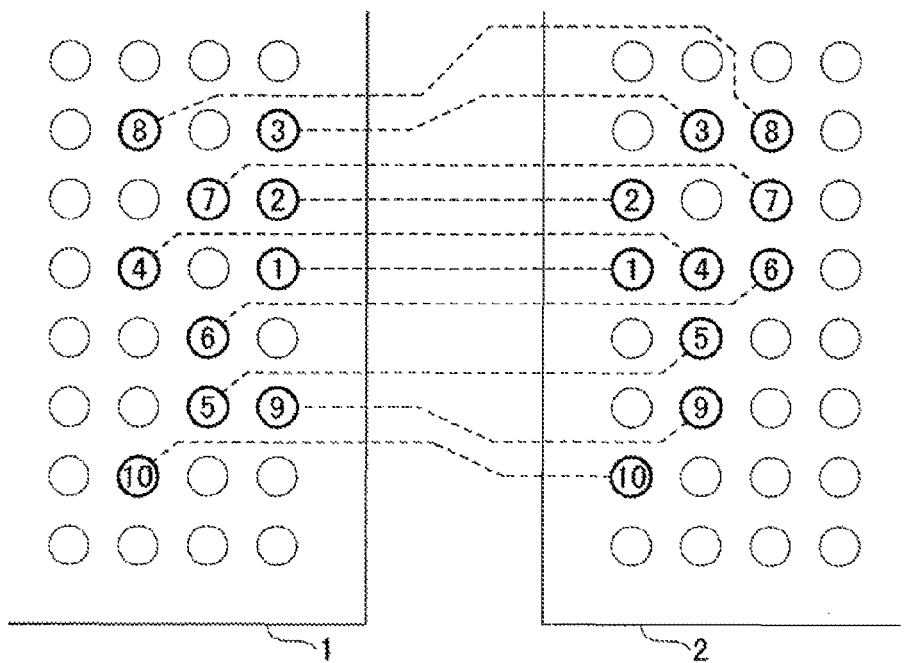
Figure 7C:
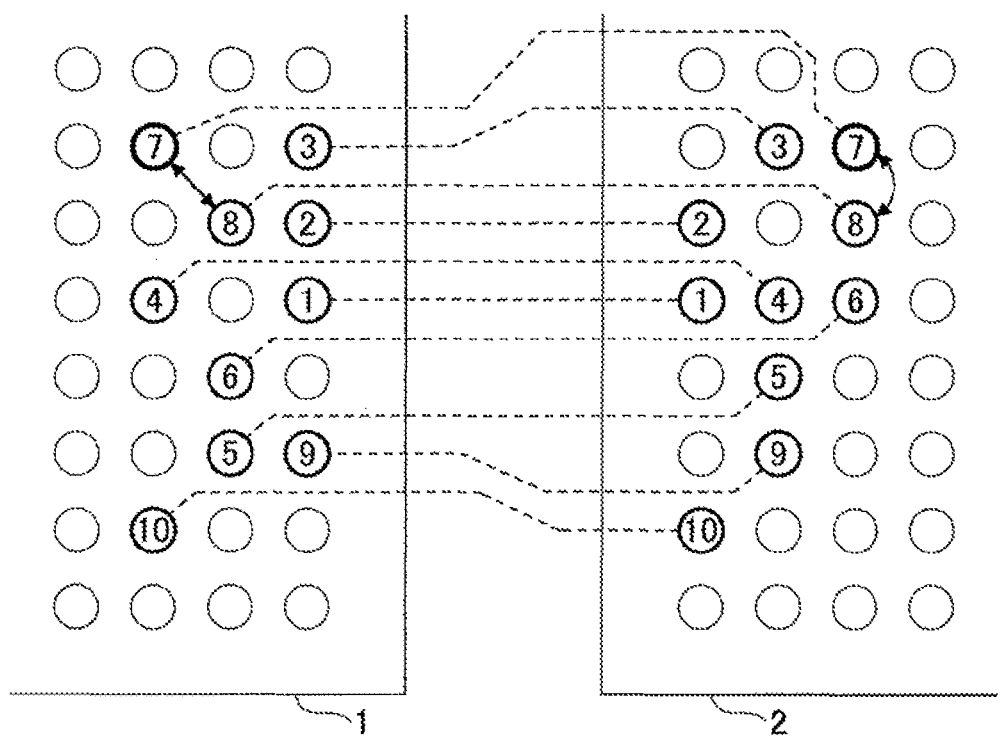

FIGS. 7A to 7C are conceptual diagrams illustrating another example of the process carried out by the routing processing part 34 in the design apparatus according to the embodiment. Note that FIG. 7A corresponds to FIG. 6B. FIG. 7B corresponds to FIG. 6C. In this example, when a specific signal such as a clock signal or differential pair signal is applied to the configuration of FIG. 7B, the result of the pin-swapping processing illustrated in FIG. 7B is corrected in the order of applying the specific signal to the pins.

For example, the result of the pin-swapping processing illustrated in FIG. 7B in which the net having the net number 7 corresponding to the clock signal is corrected such that the pins having the net number 7 are placed in outer sides of the component 1 and the component 2 as illustrated in FIG. 7C. Accordingly, the result of the pin-swapping processing may be corrected such that the pins applied with the specific signal are arranged in the order of applying the specific signal to the pins, which may implement high-density wire-routing on the PCB while satisfying physical or electric restrictions. In FIG. 7A, even if all the virtually wire-connected pins have the matched net names, the processing of FIG. 7C may still be carried out.

FIGS. 8A to 8D are conceptual diagrams illustrating another example of the process carried out by the routing processing part 34 in the design apparatus according to the embodiment. Note that FIG. 8A corresponds to FIG. 6B. The component 1 and the component 2 in FIG. 8 may be, for example, FPGAs having the swappable pins.

Figure 8A:
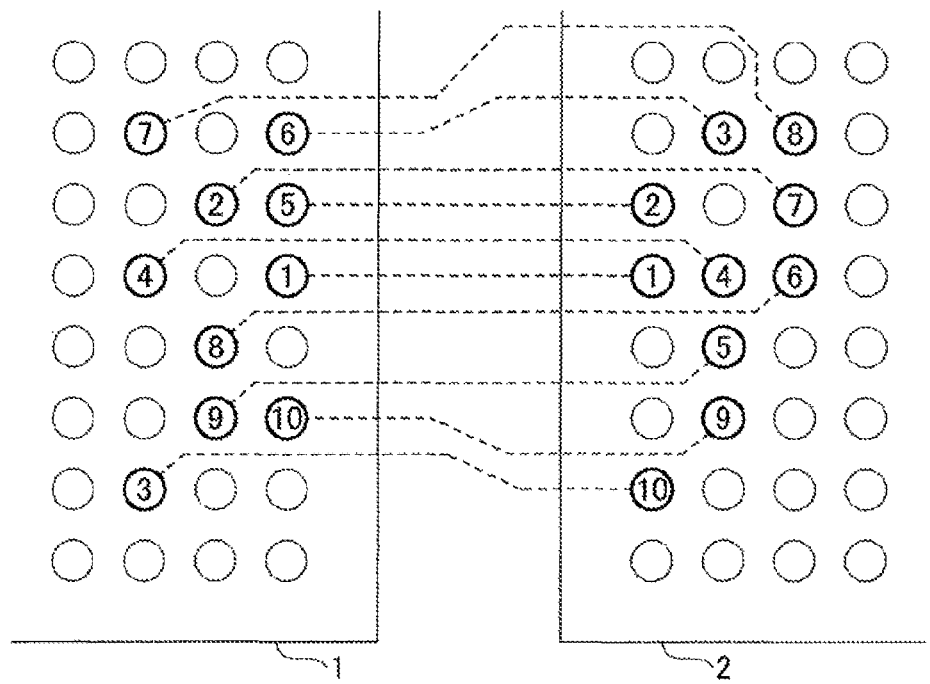
FIGS. 8A to 8D are conceptual diagrams illustrating another example of the process carried out by the routing processing part in the design apparatus according to the embodiment.

That is, since the component 1 and the component 2 both include the swappable pins in FIG. 8A, either swapping of the pins in one of the component 1 and the component 2, or swapping of the pins in both of the component 1 and the component 2 may be selected by controlling the pin-swapping processing of the component 1 and the component 2.

Figure 8B:
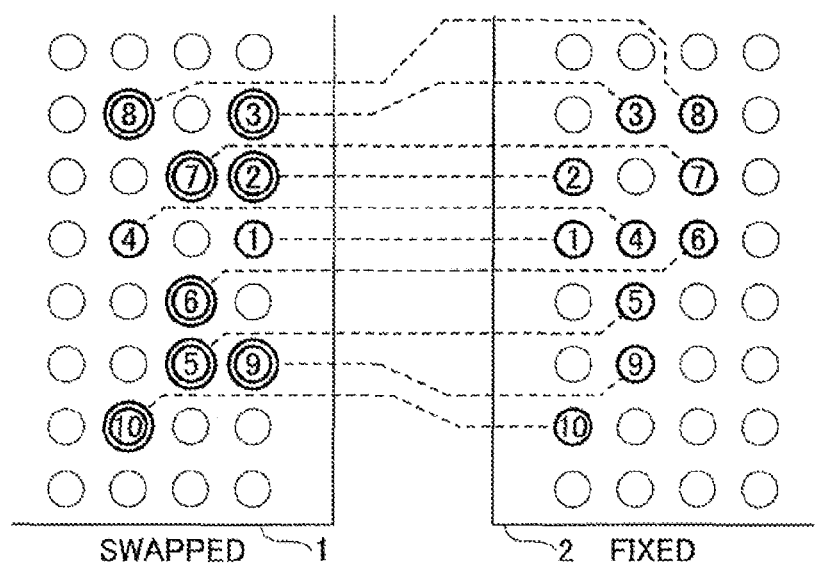
Figure 8C:
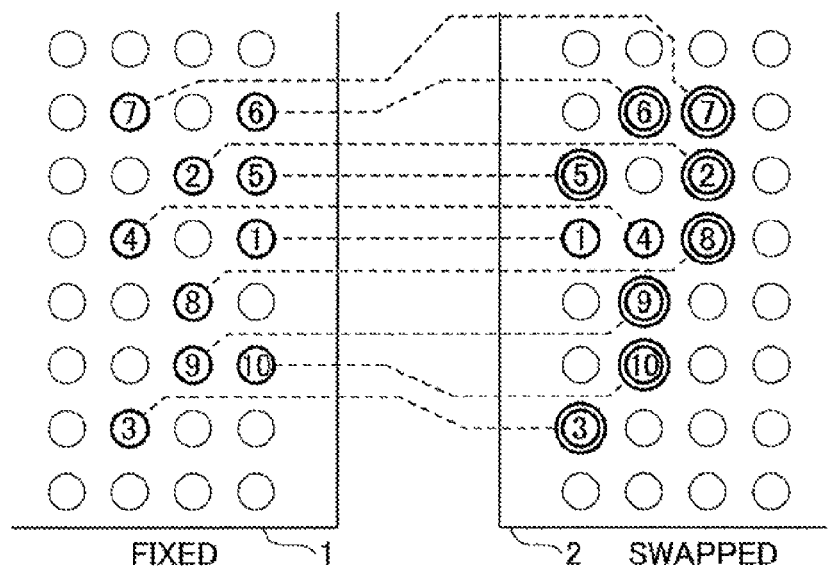
Figure 8D:
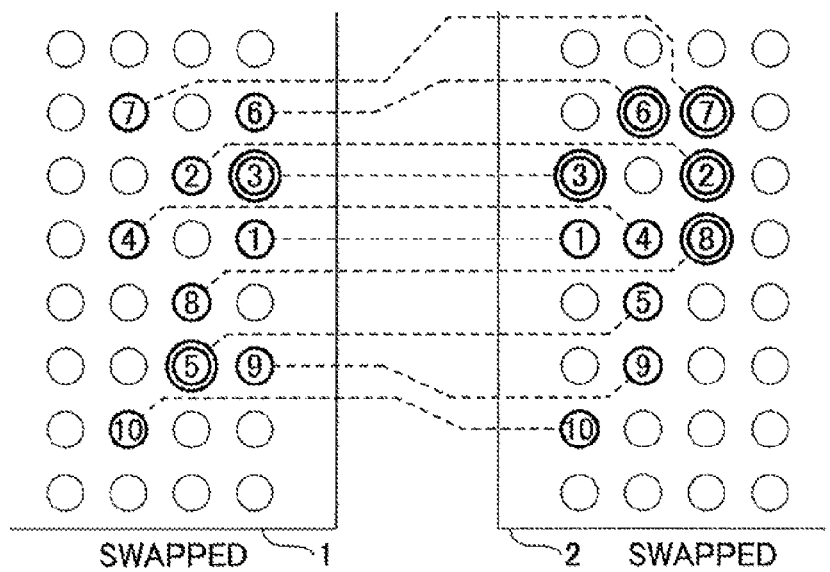
Figure 9:
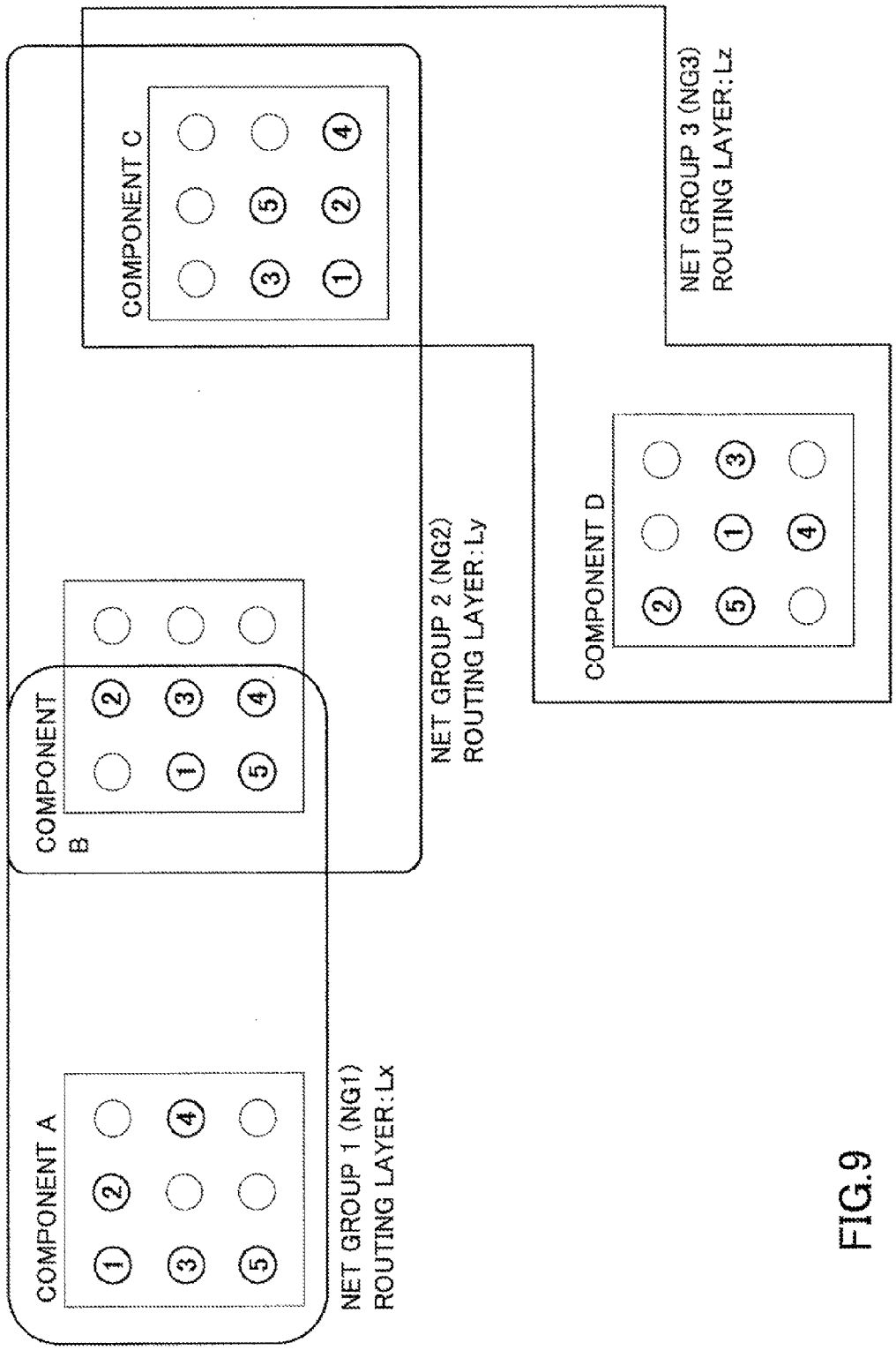
FIG. 9 is a conceptual diagram illustrating another example of the process carried out by the routing processing part in the design apparatus according to the embodiment.

FIG. 8B illustrates an example in which the pins of the component 1 are selected to be swapped while the pins of the component 2 are selected to be fixed. FIG. 8C illustrates an example in which the pins of the component 1 are selected to be swapped while the pins of the component 2 are selected to be fixed. FIG. 8D illustrates an example in which the pins of the component 1 and the pins of the component 2 are selected to be swapped.

FIG. 9 and FIGS. 10A to 10D are conceptual diagrams illustrating another example of the process carried out by the routing processing part 34 in the design apparatus according to the embodiment. The examples illustrated in FIG. 9 and FIGS. 10A to 10D include components A through D. The examples illustrated in FIG. 9 and FIGS. 10A to 10D include three net groups NG1 through NG3. In the net group NG1, the components A and B are connected in a routing layer Lx. In the net group NG2, the components B and C are connected in a routing layer Ly. In the net group NG3, the components C and D are connected in a routing layer Lz.

If the signal applied to one of the net groups NG1 through NG3 (e.g., the net group NG1) is applied to another net groups (e.g., the net groups NG2 and NG3), the pin-swapping processing of the net groups NG2 and NG3 is automatically performed in coordination with the pin-swapping processing of the net group NG1.

FIG. 10A illustrates the components A through D arranged by utilizing the simple single-layer wire-routing method such as the max-flow algorithm that the actual wires routed on the PCB satisfy physical or electric restrictions.

Figure 10B:
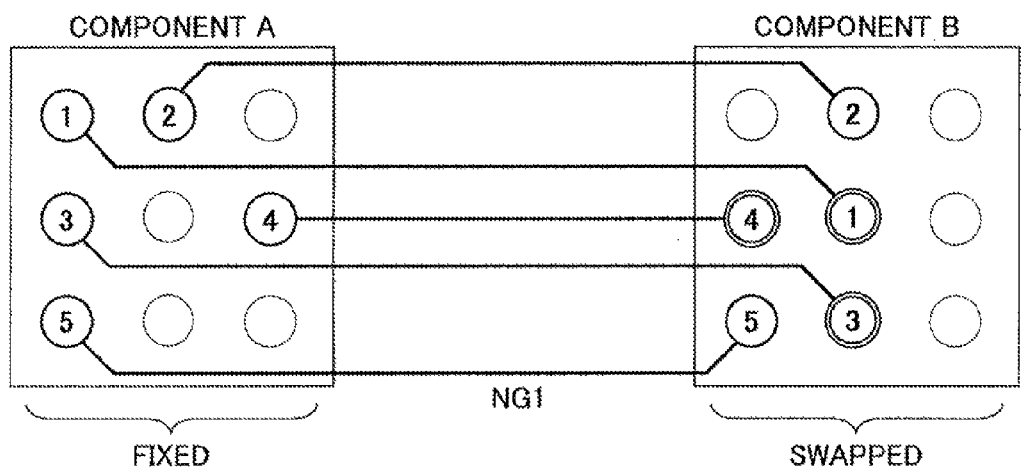
Figure 10C:
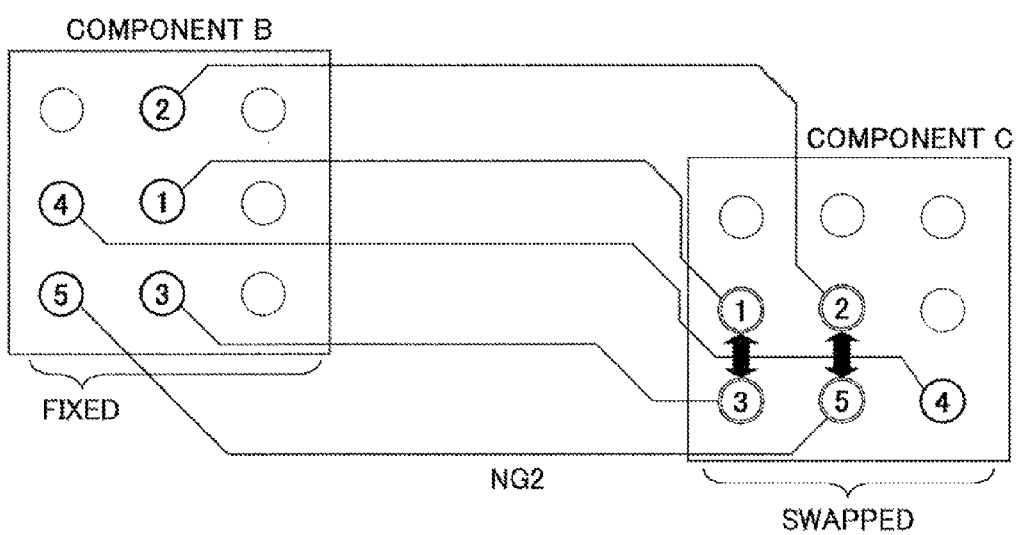
Figure 10D:
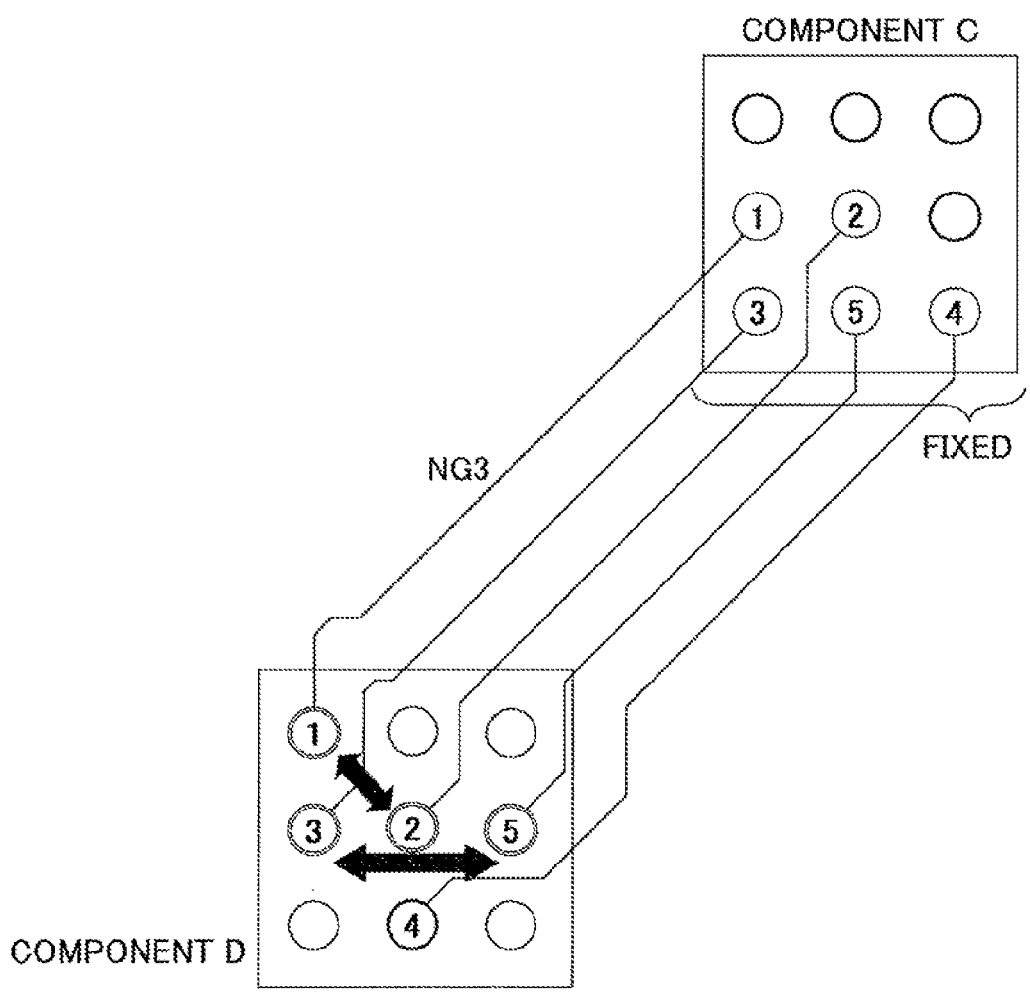

In FIG. 10B, the pin arrays of the component A are fixed while the counter part pin arrays of the component B connected to the component A are swapped in NG1. In FIG. 10C, the pin arrays of the component B are fixed in coordination with the pin-swapping processing of NG1 and the counter part pin arrays of the component C connected to the component C are swapped in NG2. In FIG. 10D, the pin arrays of the component C are fixed in coordination with the pin-swapping processing of NG2 and the counter part pin arrays of the component D connected to the component C are swapped in NG3.

Figure 11:
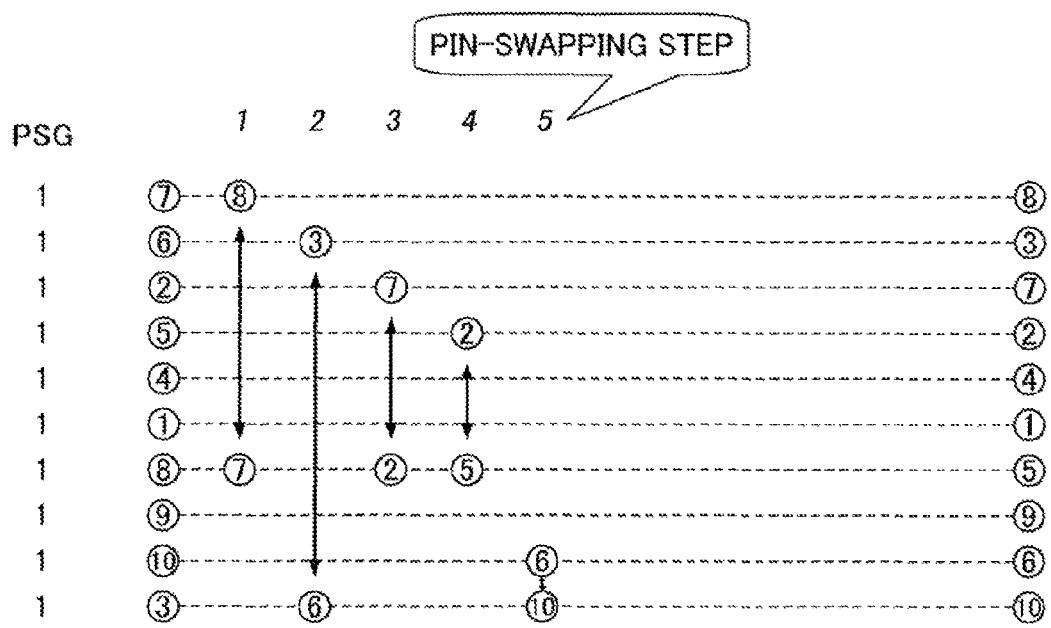
FIG. 11 is a conceptual diagram illustrating an example of a pin-swapping method carried out by a pin-swapping processing part arranged in the design apparatus according to the embodiment.

FIG. 11 is a conceptual diagram illustrating an example of the pin-swapping processing carried out by the pin-swapping processing part 43 arranged in the design apparatus according to the embodiment. Note that the example of FIG. 11 illustrates a case where all the pins are swappable. Note that circles in FIG. 11 represent the pins (via-holes). Encircled numerals in FIG. 11 represent the net numbers, which are examples of the net names.

In FIG. 11, the encircled numeral arrays placed in outermost sides represent the net numbers allocated to the corresponding pins after the components A through D are arranged by utilizing the simple single-layer wire-routing method such as the max-flow algorithm that the actual wires routed on the PCB satisfy physical or electric restrictions. Note that numerals of a pin-swapping group (PSG) represent pin-swapping group numbers of the pins. Note that the pins having the same pin-swapping numbers may be mutually swappable. Note that broken lines in FIG. 11 represent the virtually wire-connected pins. The leftmost encircled numeral array indicate the net numbers allocated to one of the components that includes the pins to be swapped.

FIG. 11 further illustrates a process in which the pin-swapping processing is progressed in a direction from the left to the right. One pin-swapping processing corresponds to one pin-swapping step. In FIG. 11, an uppermost number array indicates the pin-swapping step numbers. That is, in FIG. 11, the uppermost number array of 1 through 5 indicates five pin-swapping steps.

The pin-swapping processing part 43 swaps the pins in the order from the outer side (the upper side in FIG. 11) to the inner side such that the net number of the pin matches the net number (rightmost encircled numeral array in FIG. 11) of the counterpart pin of the other component.

For example, in the pin-swapping step number 1, the pin having the net number 7 of one component is swapped with the pin having the net number 8, such that the pin of the component has the same net number as the net number 8 of the counterpart pin of the other component.

Similarly, in the pin-swapping step number 2, the pin having the net number 6 of one component is swapped with the pin having the net number 3, such that the pin of the component has the same net number as the net number 3 of the counterpart pin of the other component.

Similarly, in the pin-swapping step number 3, the pin having the net number 2 of one component is swapped with the pin having the net number 7, such that the pin of the component has the same net number as the net number 7 of the counterpart pin of the other component.

Similarly, in the pin-swapping step number 4, the pin having the net number 5 of one component is swapped with the pin having the net number 2, such that the pin of the component has the same net number as the net number 2 of the counterpart pin of the other component.

Similarly, in the pin-swapping step number 5, the pin having the net number 10 of one component is swapped with the pin having the net number 6, such that the pin of one component has the same net number as that of the counterpart pin of the other component. The pin-swapping processing part 43 performs no pin-swapping processing if the virtually wire-connected pins of one component have the same net numbers as those of the virtually routed pins of the other component.

As illustrated in FIG. 11, one or more net numbers of the pins of one component may match the net numbers of the counterpart pins of the other component after performing one pin-swapping processing. For example, suppose that the net number of the pin of one component matches the net number of the corresponding pin of the other component k times (i.e., by performing k pin-swapping steps), and the net numbers of the corresponding pins of the two components are matched at k+1th time. In this case, the number of pins having the matched net numbers is k+2. If the number of pin-swapping processing steps carried out until the two pins have the matched net numbers is defined as one loop, the minimum number of pin-swapping times for the total number of pins may be computed by calculating the number of loops for the total number of pins.

In the initial phase, if the number of pins having mismatched net numbers is defined as m and the number of loops is defined as p, the minimum pin-swapping times may be m−p times. Note that since the loops are mutually independent, the order of performing the pin-swapping processing may be different between the loops without affecting the calculated result. The pin-swapping method illustrated in FIG. 11 is utilized for matching the different net numbers of the two pins by swapping the pin of one component having the net number that mismatches the net number of the counterpart pin of the other component with the pin having the net number that matches the net number of the counterpart pin. Accordingly, the pin-swapping method illustrated in FIG. 11 is equivalent to the process that computes the minimum number of pin-swapping times; that is, the pin-swapping method illustrated in FIG. 11 may compute the optimal solution of the minimum number of pin-swapping times.

For example, if all the pins of one component are swappable, the pin-swapping processing part 43 may compute the solution of the minimum number of pin-swapping times by carrying out the following procedures under the following conditions.

The number of intended nets: S
Virtual wire-routing order: i=1, 2, . . . .
The net number of the swappable pin to be connected at ith: n(i)

Figure 12:
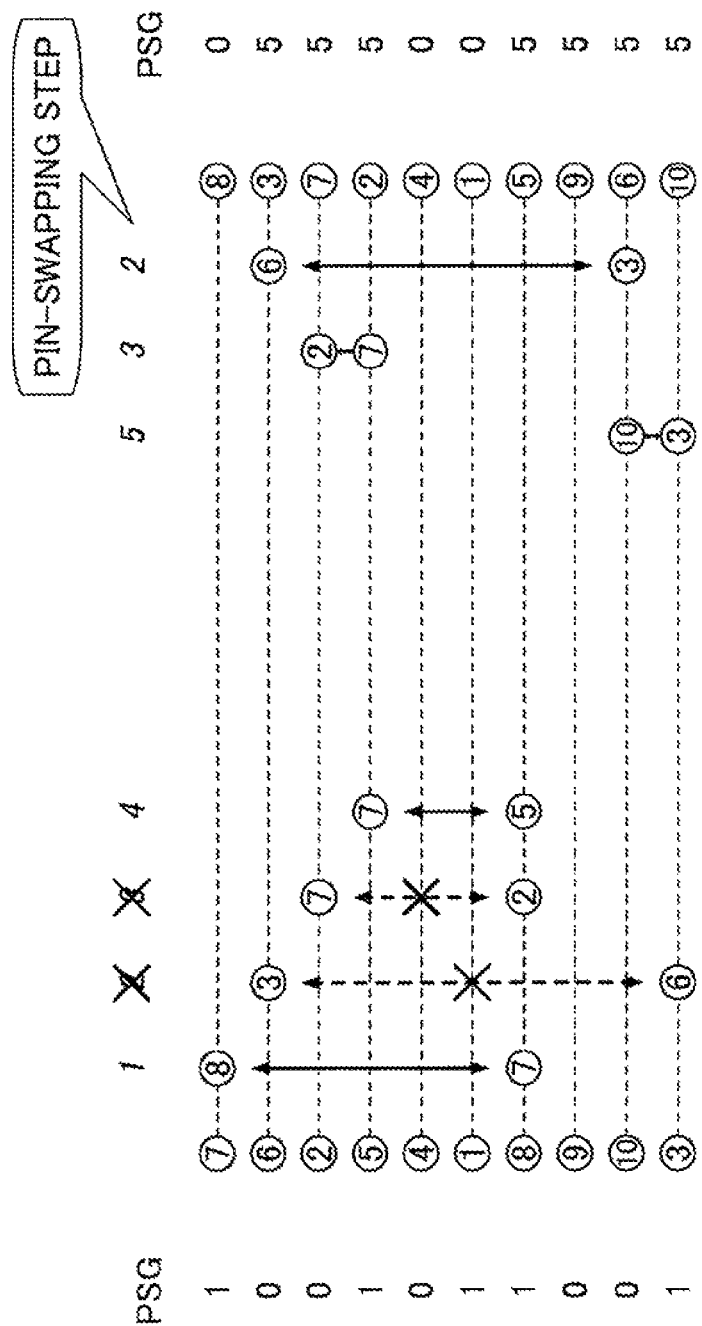
FIG. 12 is a conceptual diagram illustrating another example of the pin-swapping method carried out by the pin-swapping processing part arranged in the design apparatus according to the embodiment.

The net number of the counterpart pin to be connected at ith: m(i)
Procedure 1: Apply i=1
Procedure 2: Compute n(i) and n(j) that satisfy m(i)=n(j), and then swap the n(j) pin with the n(i) pin
Procedure 3: Repeat Procedure 2 for i=2 to i=S FIG. 12 is a conceptual diagram illustrating another example of the pin-swapping processing carried out by the pin-swapping processing part 43 arranged in the design apparatus according to the embodiment. Note that the example of FIG. 12 illustrates a case where some of the pins of one component are not swappable. FIG. 12 illustrates an example where non-swappable net numbers of the pins of one component and the net numbers of the counterpart pins of the other component are matched by swapping the swappable counterpart pins of the other component. Note that in FIG. 12, descriptions of the elements identical to those illustrated in FIG. 11 are appropriately omitted.

Note that in FIG. 12, numerals of the pin-swapping group (PSG) represent pin-swapping group numbers of the pins. That is, the pins having the pin-swapping number of 0 represent non-swappable pins whereas the pins having the pin-swapping number of 1 represent swappable pins. In FIG. 12, the pin-swapping processing may be carried out in the order of the pin-swapping step numbers.

For example, in the pin-swapping step number 1, the pin having the net number 7 of one component is swapped with the pin having the net number 8, such that the pin of the component has the same net number as the net number 8 of the counterpart pin of the other component.

Subsequently, since the pin having the net number 6 of one component is non-swappable, the net numbers of the pins of the two components are matched by swapping the counterpart pin of the other component utilizing the pin-swapping method illustrated in FIG. 12. Specifically, in the pin-swapping step number 2, the counterpart pin having the net number 3 of the other component is swapped with the pin having the net number 6, such that the counterpart pin of the other component has the same net number as the net number 6 of the pin of the component.

Subsequently, since the pin having the net number 2 of one component is non-swappable, in the pin-swapping step number 3, the counterpart pin having the net number 7 of the other component is swapped with the pin having the net number 2, such that the counterpart pin of the other component has the same net number as the net number 2 of the pin of the component.

Similarly, in the pin-swapping step number 4, the pin having the net number 5 of one component is swapped with the pin having the net number 7, such that the pin of the component has the same net number as the net number 7 of the counterpart pin of the other component.

Subsequently, since the pin having the net number 10 of one component is non-swappable, in the pin-swapping step number 5, the counterpart pin having the net number 3 of the other component is swapped with the pin having the net number 10, such that the counterpart pin of the other component has the same net number as the net number 10 of the pin of the component.

Similar to the method of FIG. 11, the pin-swapping method illustrated in FIG. 12 is utilized for matching the different net numbers of the two pins by swapping the pin of one component having the net number that mismatches the net number of the counterpart pin of the other component with the pin having the net number that matches the net number of the counterpart pin. The pin-swapping method illustrated in FIG. 12 is equivalent to the process that computes the minimum number of pin-swapping times; that is, the pin-swapping method illustrated in FIG. 12 may compute the optimal solution of the minimum number of pin-swapping times.

For example, if one of the components includes non-swappable pins and swappable pins of the other component are swapped, such that the net numbers of the pins of the component match the net numbers of the counterpart pins of the other components, the pin-swapping processing part 43 may compute the solution of the minimum number of pin-swapping times by carrying out the following procedures under the following conditions.

Figure 13A:
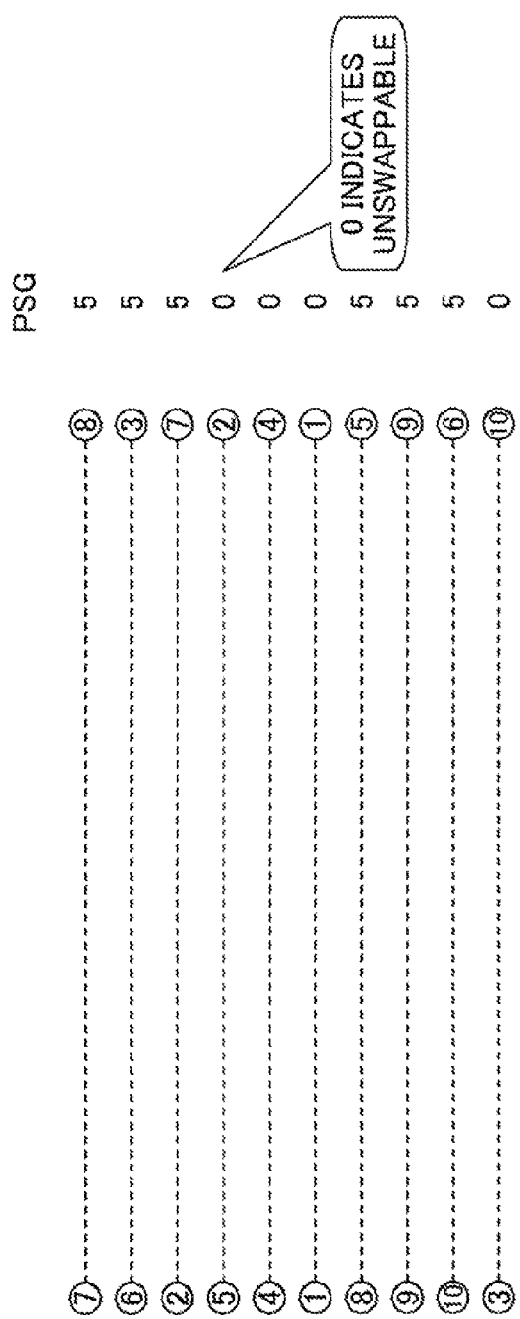
FIGS. 13A and 13B are conceptual diagrams illustrating another example of the pin-swapping method carried out by the pin-swapping processing part arranged in the design apparatus according to the embodiment.
Figure 13B:
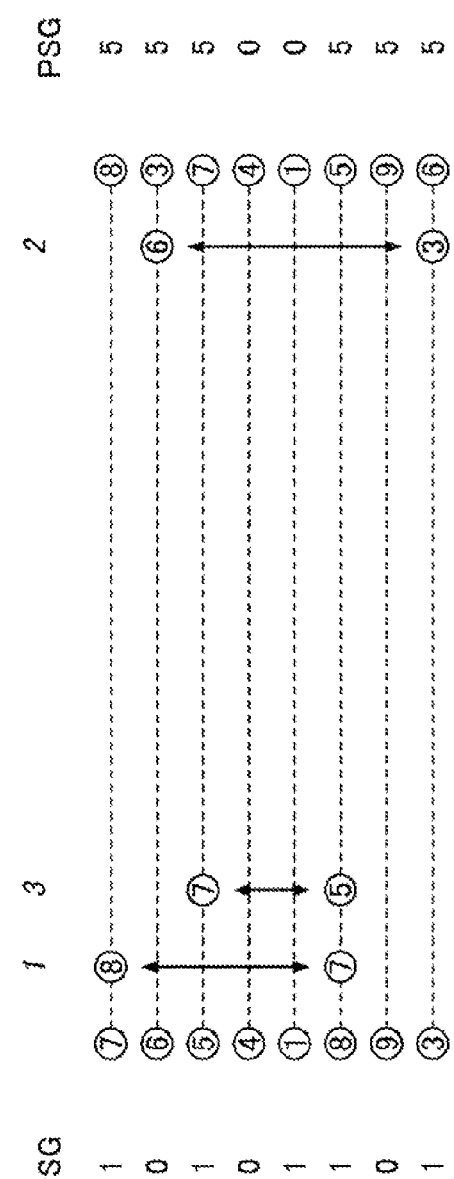

The number of intended nets: S
Virtual wire-routing order: i=1, 2, . . . .
The net number of the pin of one component n to be connected at ith: n(i)
The net number of the counterpart pin of the other component m to be connected at ith: m(i)
The pin-swapping group number of the pin of the component n to be connected at ith: np(i)
The pin-swapping group number of the counterpart pin of the other component m to be connected at ith: mp(i)
Non-swappable: np(i)=0, mp(i)=0
Procedure 1: i=1
Procedure 2: If np(i)≧1, compute n(i) and n(j) that satisfy m(i)=n(j), and then swap the n(j) pin with the n(i) pin
If np(i)=0, compute m(i) and m(j) that satisfy n(i)=m(j), and then swap m(j) pin with m(i) pin.
Procedure 3: Repeat Procedure 2 for i=2 to i=S FIGS. 13A and 13B are conceptual diagrams illustrating another example of the pin-swapping processing carried out by the pin-swapping processing part 43 arranged in the design apparatus according to the embodiment. Note that the examples of FIGS. 13A and 13B illustrate a case where some of the pins are not swappable. FIG. 13A illustrates an example where there are some nets allocated to the non-swappable pins of the both components. Note that in FIGS. 13A and 13B, descriptions of the elements identical to those illustrated in FIGS. 11 and 12 are appropriately omitted. In FIGS. 13A and 13B, the pin-swapping processing part 43 excludes the non-swappable pins having the net numbers 2 and 10 in both components.

The virtual routing processing part 42 virtually wire-connects the excluded pins in advance. The virtual routing processing part 42 virtually wire-connects the excluded pins by utilizing the simple single-layer wire-routing method such as the max-flow algorithm that the actual wires routed on the PCB satisfy physical or electric restrictions. Thereafter, the pin-swapping processing part 43 performs the pin-swapping processing in the order of the pin-swapping step numbers as illustrated in FIG. 13B, utilizing the pin-swapping method illustrated in FIG. 12.

The pin-swapping method illustrated in FIGS. 13A and 13B may not compute the solutions of the minimum number of pin-swapping times, because one component has a swappable pin but its counterpart pin of the other component may not be swappable. However, if the pin-swapping method illustrated in FIGS. 13A and 13B computes the solutions, the optimal one of the solutions may be figured out.

For example, if the two components include non-swappable pins and there are some net numbers allocated to the non-swappable pins of the both components, the pin-swapping processing part 43 may compute the solution of the minimum number of pin-swapping times by carrying out the following procedures under the following conditions.

The number of intended nets: S
Virtual wire-routing order: i=1, 2, . . . .

The net number of the pin of one component n to be connected at ith: n(i)

The net number of the counterpart pin of the other component m to be connected at ith: m(i)

The pin-swapping group number of the pin of the component n to be connected at ith: np(i)

The pin-swapping group number of the counterpart pin of the other component m to be connected at ith: mp(i)

Non-swappable: np(i)=0, mp (i)=0

Procedure 1: Compute all the net numbers n(i) that satisfy n(i)=m(j), np(i)=0 and mp(j)=0, and then exclude the nets corresponding to the computed net numbers n(i) from the intended nets Procedure 2: Virtual wire-connects the pins having the excluded net numbers Procedure 3: i=1

Procedure 4: If np(i)≧1, compute m(i) and n(j) that satisfy m(i)=n(j), and then swap the n(j) pin with the n(i) pin If np(i)=0, compute m(i) and m(j) that satisfy n(i)=m(j), and then swap m(j) pin with m(i) pin Procedure 5: Repeat Procedure 4 for i=2 to i=(S−the number of excluded nets)

Figure 14:
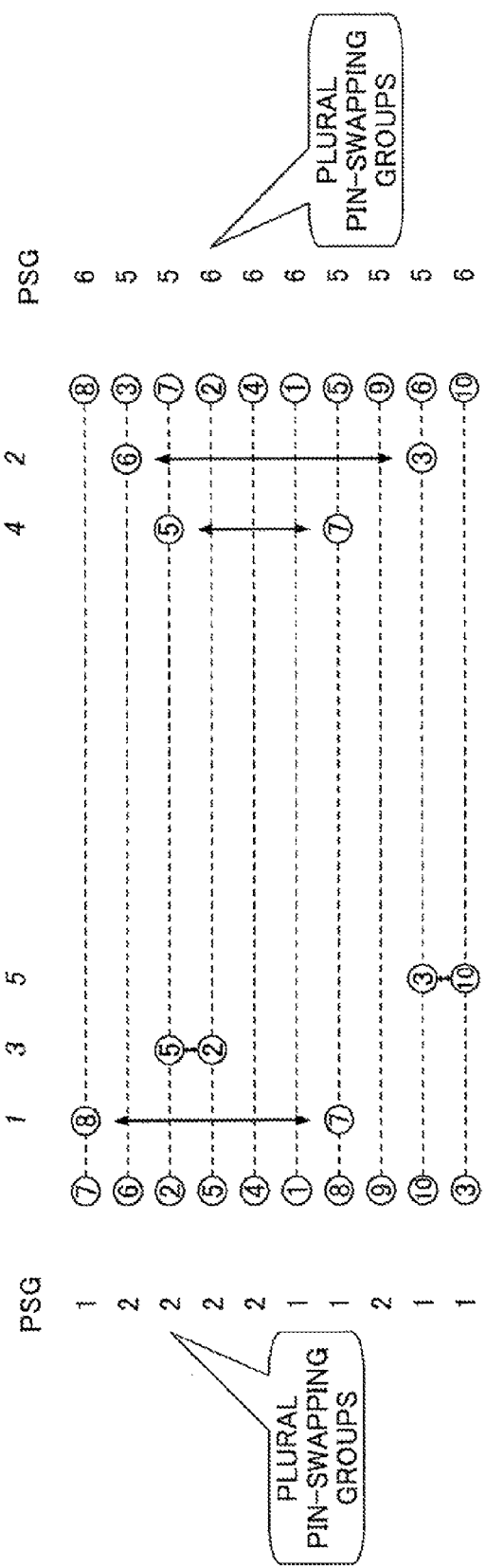
FIG. 14 is a conceptual diagram illustrating another example of the pin-swapping method carried out by the pin-swapping processing part arranged in the design apparatus according to the embodiment.

FIG. 14 is a conceptual diagram illustrating another example of the pin-swapping processing carried out by the pin-swapping processing part 43 arranged in the design apparatus according to the embodiment. Note that the example of FIG. 14 illustrates a case where the both components include the pins of the plural pin-swapping groups. Note that in FIG. 14, descriptions of the elements identical to those illustrated in FIGS. 11 and 13B are appropriately omitted. In FIG. 14, the pin-swapping processing may be carried out in the order of the pin-swapping step numbers.

In the pin-swapping step number 1, the pin having the net number 7 of one component is swapped with the pin having the net number 8, such that the pin of the component has the same net number as the net number 8 of the counterpart pin of the other component.

Subsequently, the pin having the net number 6 of one component is attempted to be swapped with the pin having the net number 3, such that the pin of the component has the same net number as the net number 3 of the counterpart pin of the other component. However, the pin having the net number 3 of the component is associated with the pin-swapping group (i.e., PSG=1) differing from the pin-swapping group (i.e., PSG=2) of the pin having the net number 6 of the component.

Accordingly, in the pin-swapping step number 2, the counterpart pin (having the net number 3 in this case) of the other component is attempted to be swapped with the pin (having the net number 6 in this case) of the other component, such that the net number of the pin of the component matches that of the pin of the other component.

Specifically, in the pin-swapping step number 2, the counterpart pin having the net number 3 of the other component is swapped with the pin having the net number 6, such that the counterpart pin of the other component has the same net number as the net number 6 of the pin of the component.

Thus, in the pin-swapping method illustrated in FIG. 14, if the two mutually swappable pins of one component are associated with different pin-swapping groups (PSG), the counterpart pin of the other component is attempted to be swapped with the pin having the same net number as that of the pin of the component in the subsequent steps, in a similar manner as the pin-swapping step number 2. In the pin-swapping method illustrated in FIG. 14, if the two mutually swappable pins of the other component are also associated with different pin-swapping groups (PSG), the pin-swapping processing may be performed on the pin having the subsequent net number.

The pin-swapping method illustrated in FIG. 14 may not compute the solutions of the minimum number of pin-swapping times, because the mutually swappable pins of one component are associated with different pin-swapping groups and those of the other component are also associated with different pin-swapping groups. However, if the pin-swapping method illustrated in FIG. 14 computes the solutions, the optimal one of the solutions may be figured out.

For example, if each of the two components includes the mutually swappable pins associated with different pin-swapping groups, the pin-swapping processing part 43 computes the solution of the minimum number of pin-swapping times by carrying out the following procedures under the following conditions.

The number of intended nets: S

Virtual wire-routing order: i=1, 2, . . . .

The net number of the pin of one component n to be connected at ith: n(i)

The net number of the counterpart pin of the other component m to be connected at ith: m(i)

The pin-swapping group number of the pin of the component n to be connected at ith: np(i)

The pin-swapping group number of the counterpart pin of the other component m to be connected at ith: mp(i)

Non-swappable: np(i)=0, mp(i)=0

Procedure 1: i=1

Procedure 2: If np(j)=np(i) corresponding to j that satisfies m(i)=n(j), then swap the n(j) pin with the n(i) pin, and go to Procedure 4

If np(j)≠np(i), then go to Procedure 3

Procedure 3: If mp(j)=mp(i) corresponding to j that satisfies n(i)=m(j), then swap the m(j) pin with the m(i) pin, and go to Procedure 4

If mp(j)≠mp(i), then go to Procedure 4

Procedure 4: Repeat Procedure 2 for i=2 to i=S

Figure 15A:
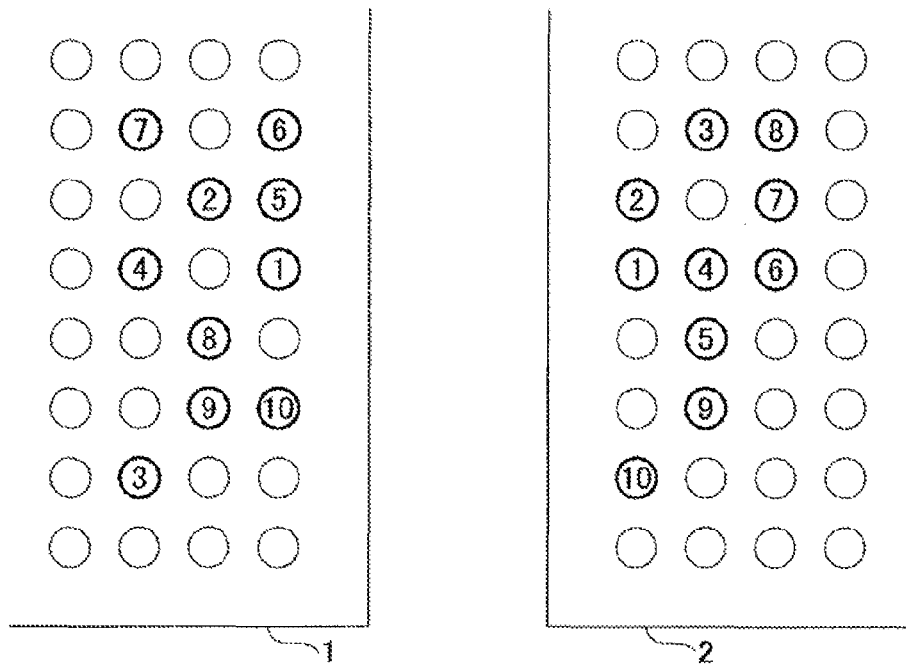
Figure 15B:
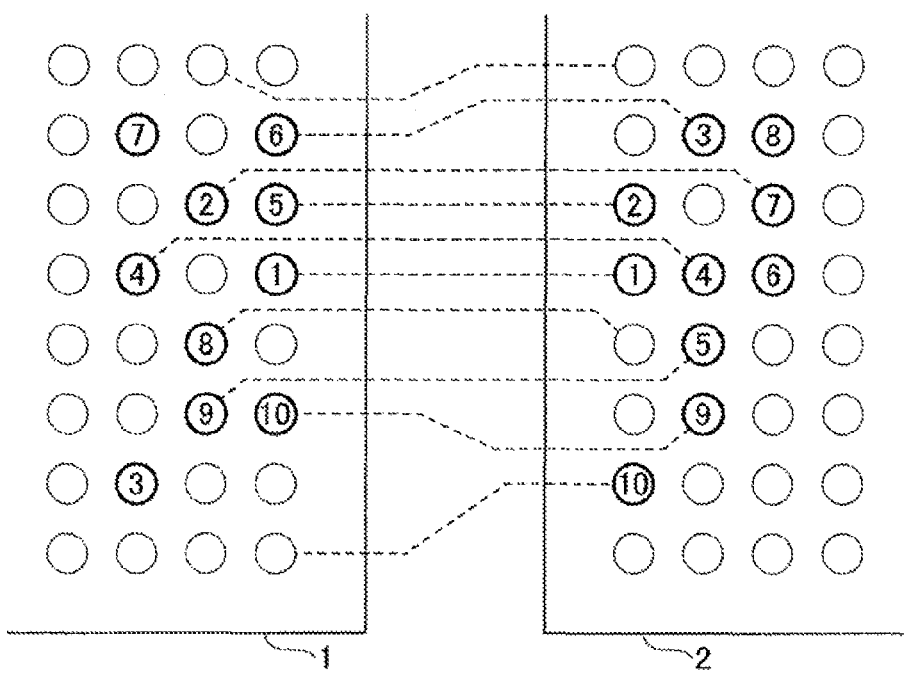

FIGS. 15A to 15C are conceptual diagrams illustrating an example of a process carried out by the routing processing part 34 in the design apparatus according to the embodiment. FIG. 15A illustrates net groups of pins corresponding to the component 1 and the component 2 connected in a single layer. Note that circles in FIG. 15A to FIG. 15C represent pins (via-holes). Encircled numerals in FIGS. 15A to 15C represent the net numbers, which are examples of the net names. In FIGS. 15A to 15C, the circles excluding the encircled numerals represent swappable dummy net pins. The pins of the component 1 and the component 2 in FIG. 15A to FIG. 15C represent swappable pins.

In FIG. 15B, the pins of the component 1 and the component 2 illustrated in FIG. 15A are virtually connected by utilizing the simple single-layer wire-routing method such as the max-flow algorithm that the actual wires routed on the PCB satisfy physical or electric restrictions. The virtual wire connection of the pins illustrated in FIG. 15B indicates an example where swappable dummy net pins are allowed for use in the virtual wire connection of the pins of the component 1 and the component 2.

In FIG. 15B, dummy net pins are used instead of the pins having the net numbers 3 and 7 of the component 1 for virtual wire connection of the pins in the component 1 and the component 2. Further, in FIG. 15B, dummy net pins are used instead of the pins having the net numbers 6 and 8 of the component 2 for virtual wire connection of the pins in the component 1 and the component 2. In FIG. 15C, some of the virtually wire-connected pins or dummy net pins in FIG. 15B having the mismatched net numbers are subject to the pin-swapping processing so that they are swapped with those having matched net numbers.

Note that double circles in FIG. 15C represent the swapped pins or swapped dummy net pins. In FIG. 6C, the virtually wire-connected pins or dummy net pins of the component 1 and their counterpart pins or counterpart dummy net pins of the component 2 have the same (matched) net numbers.

As described above, in the design apparatus 30 according to the embodiment, the virtual routing processing and the pin-swapping processing may be coordinated, and the pins may be automatically swapped after the wire-connecting of the pins is complete. Accordingly, the pins may be allocated while securing the implementation of the actual wire-connecting of the pins, which may minimize the cancellation and reallocation of the swapped pins.

FIGS. 16A to 16C and FIGS. 17A to 17C are conceptual diagrams illustrating another example of the process carried out by the routing processing part 34 in the design apparatus according to the embodiment. Note that in FIGS. 16A to 16C and FIGS. 17A to 17C, descriptions of the components identical to those illustrated in FIGS. 6A to 6C and the like are appropriately omitted.

Figure 16A:
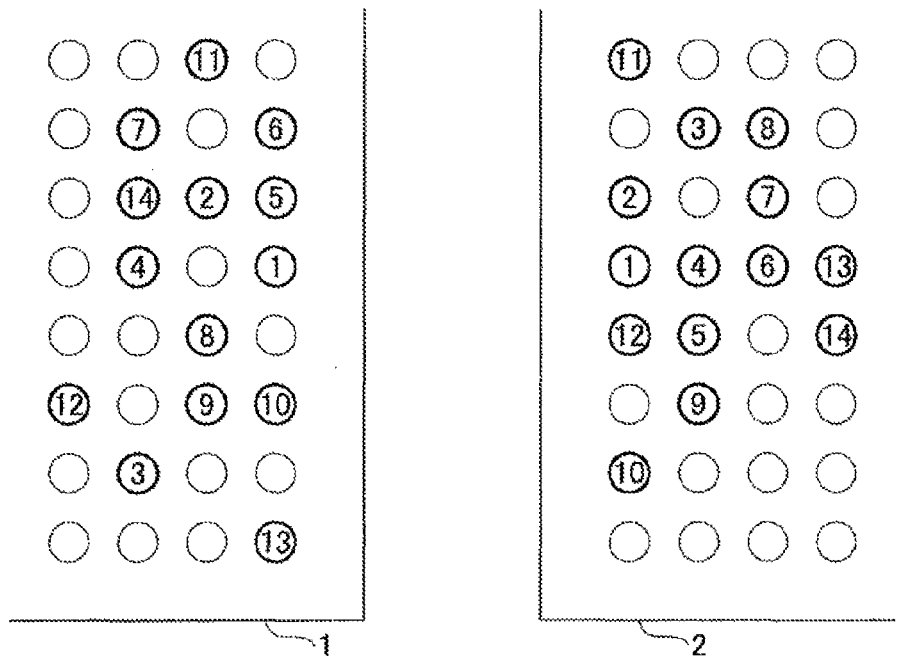
Figure 16B:
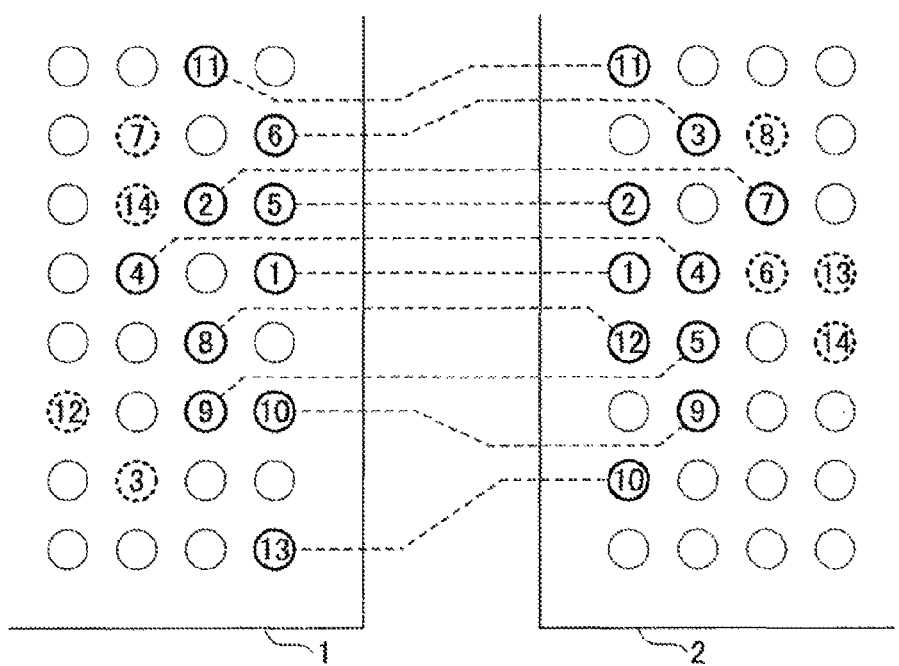

FIG. 6A illustrates net groups of pins corresponding to the component 1 and the component 2 connected in a single-layer (Lx layer). In FIG. 16B, the pins of the component 1 and the component 2 illustrated in FIG. 16A are virtually wire-connected by utilizing the simple single-layer wire-routing method such as the max-flow algorithm that the actual wires routed on the PCB satisfy physical or electric restrictions. FIG. 16B illustrates a virtual wire connection of the pins of the component 1 and the component 2, in which the pins are virtually connected regardless of the net numbers of the respective pins; however, part of the pins of the component 1 and the component 2 are unconnected. Note that dotted circles in FIGS. 16B and 16C represent the un-connected pins.

In FIG. 16C, some of the virtually wire-connected pins in FIG. 16B having the mismatched net numbers are subject to the pin-swapping processing so that they are swapped with those having matched net numbers. After performing the pin-swapping processing, the virtually wire-connected pins of the component 1 and their counterpart pins of the component 2 in FIG. 16B have the same (matched) net numbers in FIG. 16C.

However, some of the pins represented by dotted circles remain unconnected in FIG. 16C. If some of the pins remain unconnected, the routing processing part 34 virtually wire-connects the unconnected pins of the component 1 and the component 2 illustrated in FIG. 17A in a different single layer (Ly layer) by utilizing the simple single-layer wire-routing method such as the max-flow algorithm that the actual wires routed on the PCB satisfy physical or electric restrictions as illustrated in FIG. 17B.

Figure 17A:
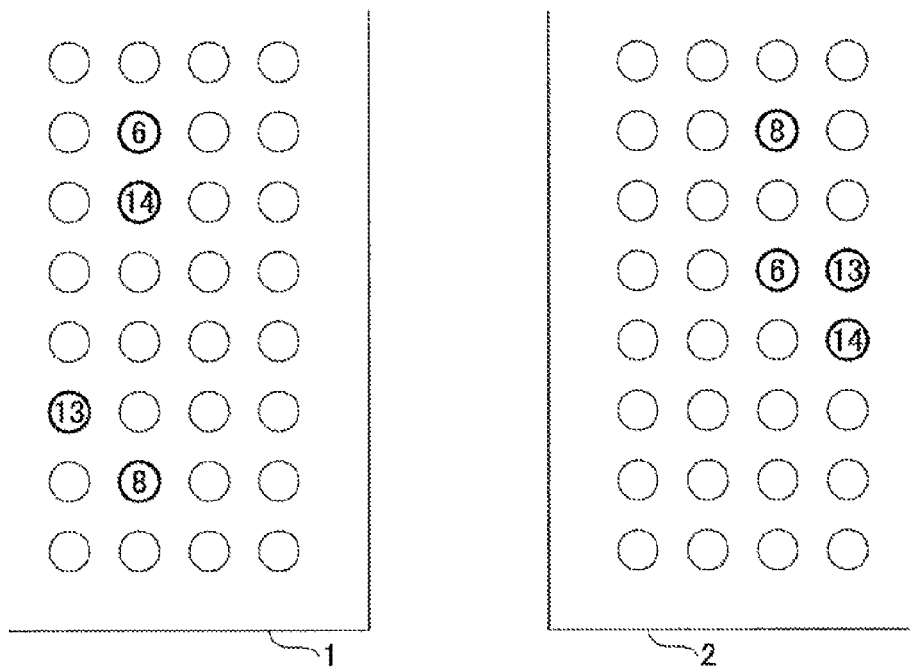
Figure 17B:
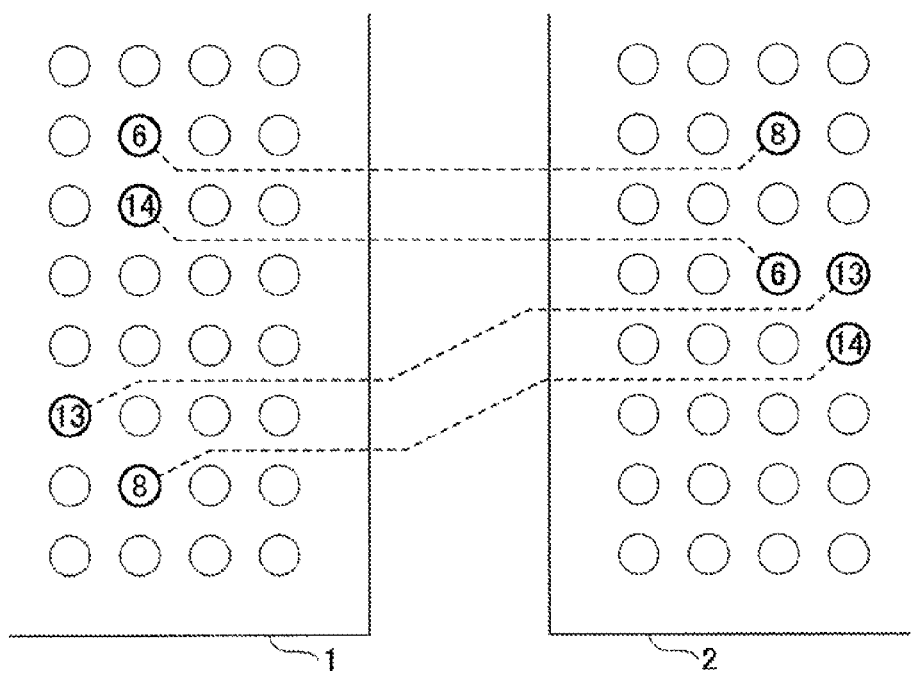

In FIG. 17C, some of the virtually wire-connected pins in FIG. 17B having the mismatched net numbers are subject to the pin-swapping processing so that they are swapped with those having matched net numbers. After performing the pin-swapping processing, the virtually wire-connected pins of the component 1 and their counterpart pins of the component 2 in FIG. 17B have the same (matched) net numbers in FIG. 17C.

As described above, in the design apparatus 30 according to the embodiment, the virtual routing processing and the pin-swapping processing may be coordinated, and the pins may be swapped in the plural single-layers. Accordingly, the pins may be allocated while securing the implementation of the actual wire-connecting of the pins, which may minimize the cancellation and reallocation of the swapped pins.

Figure 18:
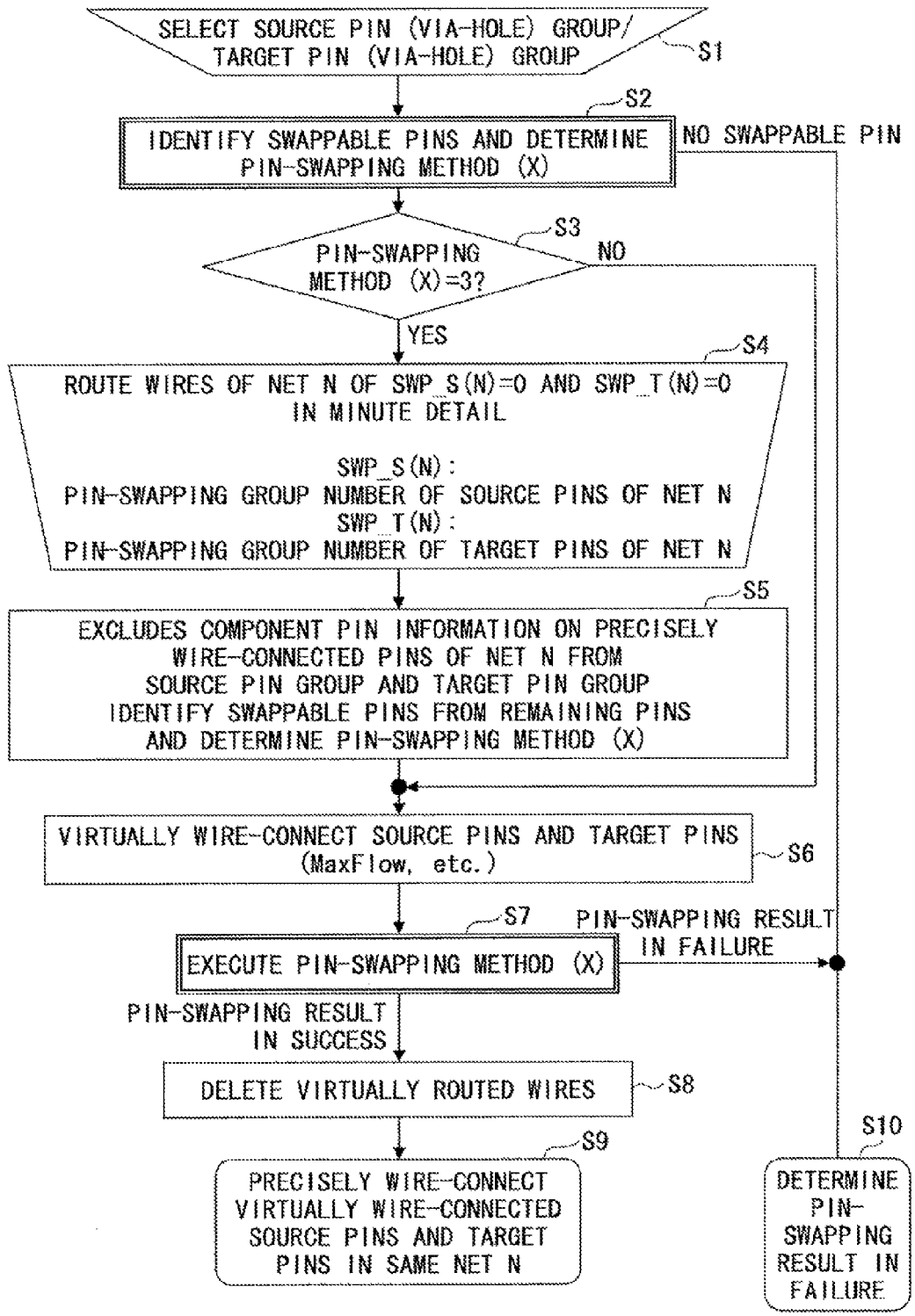
FIG. 18 is a flowchart illustrating an example of the process including steps carried out by the routing processing part in the design apparatus according to the embodiment.

FIG. 18 is a flowchart illustrating an example of the process including steps carried out by the routing processing part 34 in the design apparatus according to the embodiment. In the flowchart of FIG. 18, a "pin-swapping method (X)=1" indicates the pin-swapping method illustrated in FIG. 11. Further, a "pin-swapping method (X)=2" indicates the pin-swapping method illustrated in FIG. 12. Moreover, a "pin-swapping method (X)=3" indicates the pin-swapping method illustrated in FIG. 13. Further, a "pin-swapping method (X)=4" indicates the pin-swapping method illustrated in FIG. 14.

In step S1, the selecting processing part 41 selects a source pin group and a target pin group as examples of pin (via-hole) groups subject to the routing processing. The selecting processing part 4, for example, selects the source pin group and the target pin group including plural component pin information items based on the net-list and component-data recorded in the net-list recording part 35 and the component-data recording part 36.

In step S2, the pin-swapping processing part 43 identifies whether there are swappable pins, and determines the pin-swapping method (X), based on the component pin information in the source pin group and the target pin group. If there is no swappable pin, the pin-swapping processing part 43 determines that the pin-swapping process ends in failure in step S10.

If there is a swappable pin, the pin-swapping processing part 43 determines whether a parameter of the pin-swapping method (X) is "3" in step S3. If the parameter of the pin-swapping method (X) is "3" (YES in step S3), the precise routing processing part 44 precisely routes the wires of the source pins having the pin-swapping group number SWP_S (N)=0 and target pins having the pin-swapping group number SWP_T(N)=0 in the net N.

In step S5, the selecting processing part 41 excludes the component pin information corresponding to the precisely wire-connected pins of the net N from the source pin group and the target pin group. In step S3, if the parameter of the pin-swapping method (X) is not "3", or after the processing in step S5, the pin-swapping processing part 42 virtually wire-connects the source pins and the target pins based on the component pin information in the source pin group and the target pin group by utilizing the single-layer wire routing method such as the max-flow algorithm in step S6.

In step S7, the pin-swapping processing part 43 executes one of the later-described pin-swapping methods (X), where the parameter of the pin-swapping method (X) is 1, 2 or 4, based on the pin-swapping method. If the pin-swapping results in success, the precise routing processing part 44 deletes the virtually routed wires in step S8. If the pin-swapping results in failure, the pin-swapping processing part 43 determines that the pin-swapping has resulted in failure in step S10. After the deletion of the virtually routed wires, the precise routing processing part 44 precisely wire-connects the virtually wire-connected source pins and target pins in step S9.

Figure 19:
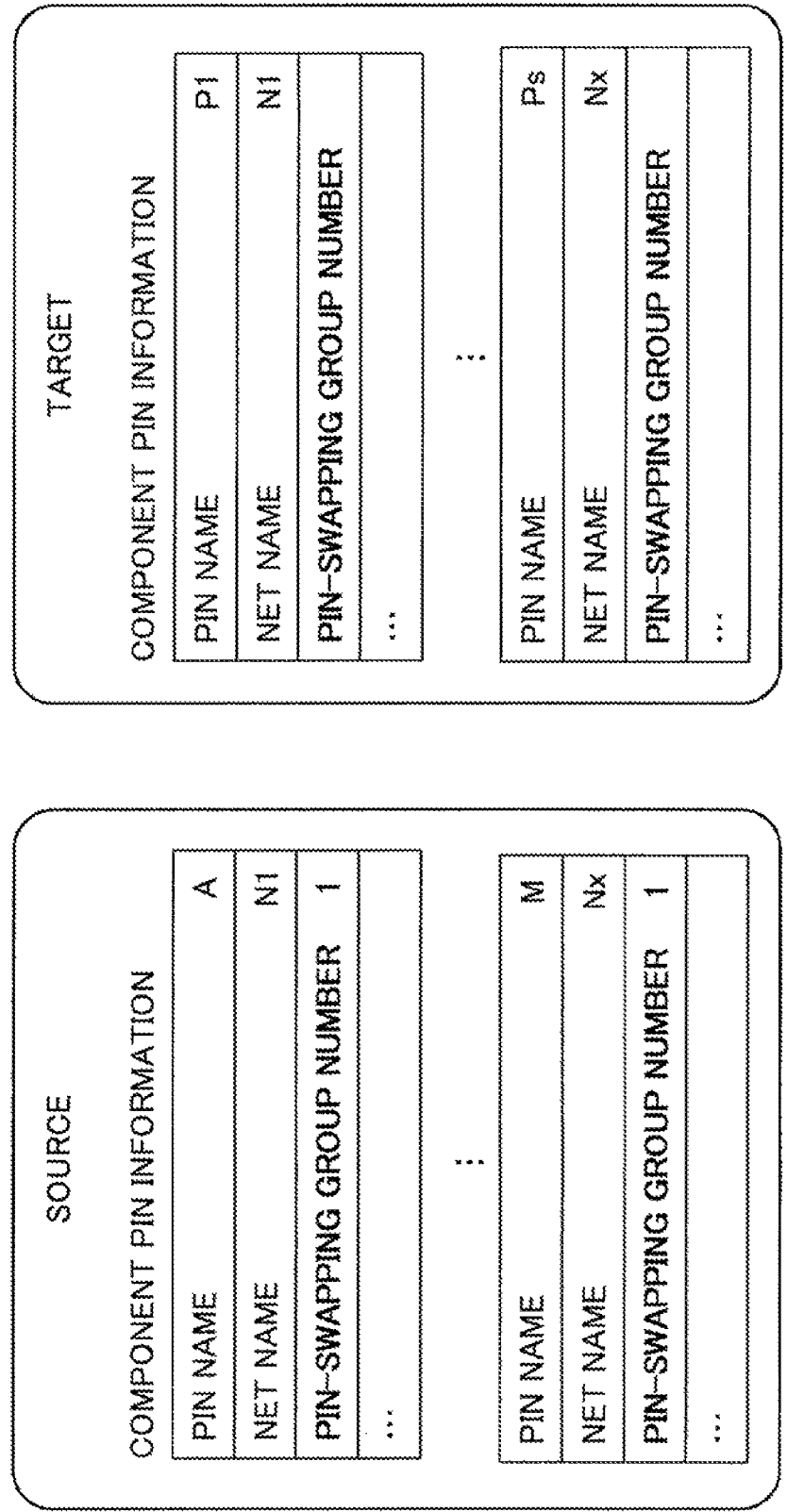
FIG. 19 is a configuration diagram illustrating examples of a source pin group and a target pin group.

FIG. 19 is a configuration diagram illustrating examples of the source pin group and the target pin group. Each of the source pin group and the target pin group illustrated in FIG. 19 includes plural items of component pin information. As illustrated in FIG. 19, each of the component pin information items includes a pin name, a net name and a pin-swapping group number.

Figure 20:
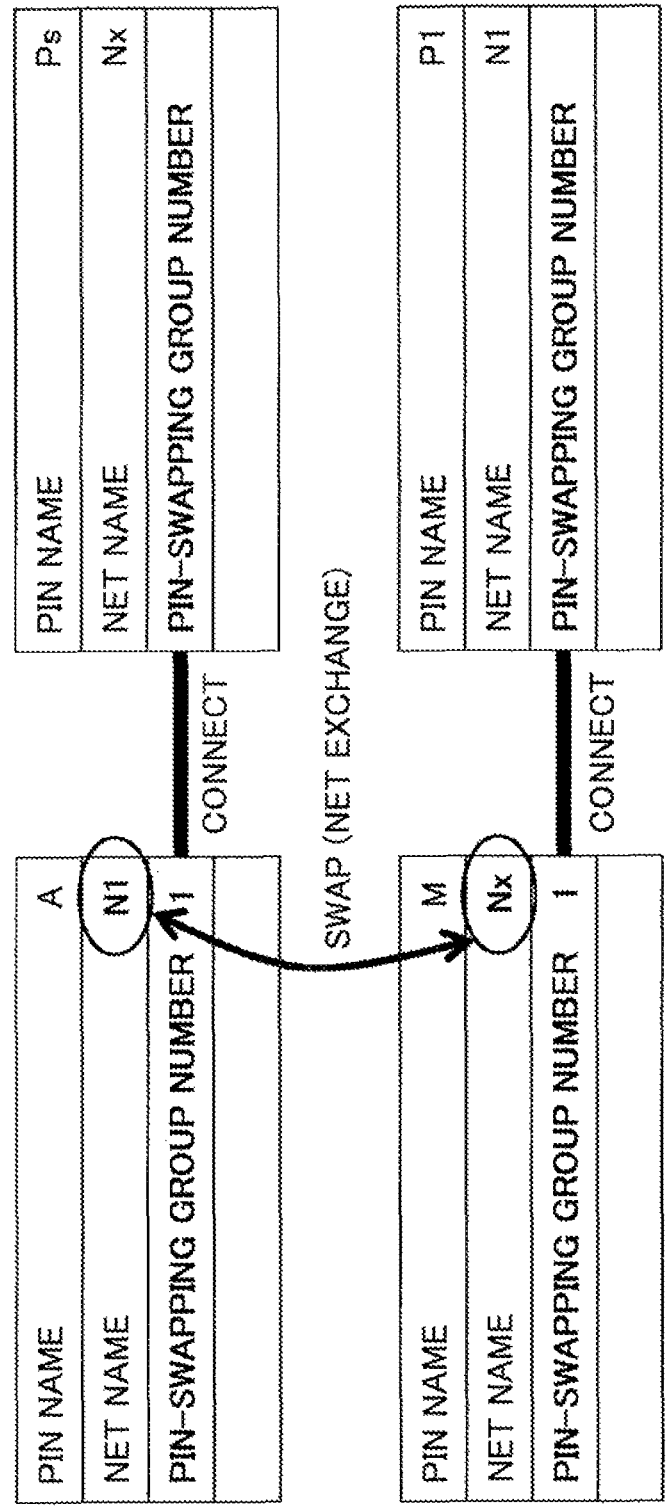
FIG. 20 is a configuration diagram illustrating an example of component pin information in which a pin-swapping result is reflected.

FIG. 20 is a configuration diagram illustrating an example of component pin information in which a pin-swapping result is reflected. The respective component pin information for the source pin and target pin illustrated in FIG. 20 is utilized in step S6, where the source pins and their counterpart target pins having unmatched net names are virtually wire-connected. In step S7, the net name of one of the component pin information is swapped (net exchange) with an appropriate net name by utilizing the pin-swapping method (X) such that the virtually wire-connected source pin and target pin include matched (same) net names, as illustrated in FIG. 20.

Figure 21:
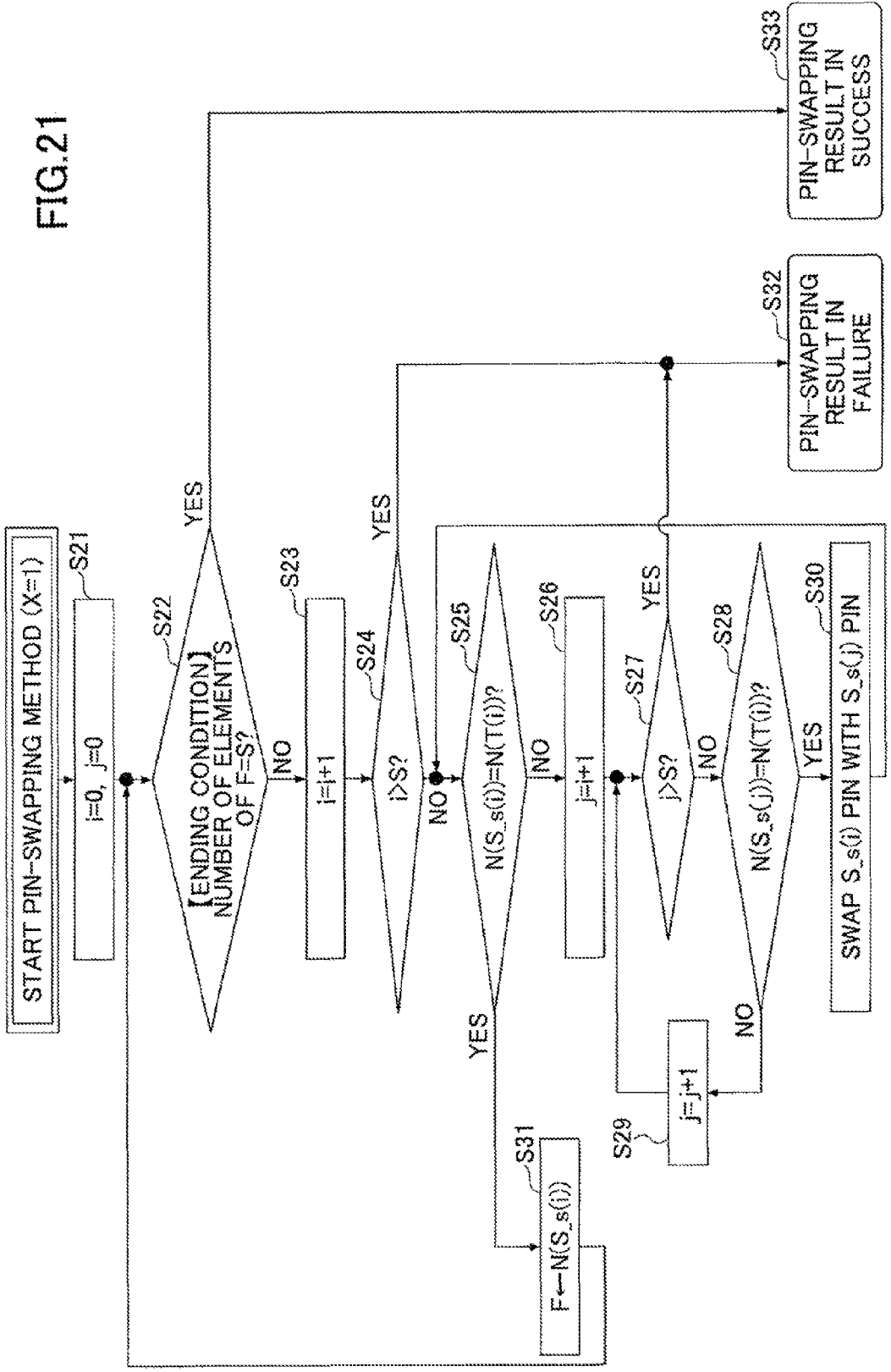
FIG. 21 is a flowchart illustrating an example of a process of the pin-swapping method (X) where a parameter (X) is 1.

FIG. 21 is a flowchart illustrating an example of a process of the pin-swapping method (X) where a parameter (X) is 1. In the flowchart of FIG. 21, S_s represents a source pin (via-hole) group (optional permutation). S represents the number of elements of the source pin (via-hole) group. S_s(i) represents an ith element of optionally permutated elements of the source pin group S_s. T(i) represents an element of the target pin group that is connected with the ith element S_s (i) of optionally permutated elements of the source pin group S_s. N(e) represents a net held by the pin (via-hole) element. F represents a net group in which a net of the source pin and that of the target pin are same (matched).

In step S21, the pin-swapping processing part 43 sets i=0 and j=0. In step S22, the pin-swapping processing part 43 determines whether the number of elements of the net group F equals an ending condition. If the number of elements of the net group F does not equal S (NO in step S22), the pin-swapping processing part 43 adds 1 to i in step S23. In step S24, the pin-swapping processing part 43 determines whether i>S is true. If i>S is not true (NO in step S24), the pin-swapping processing part 43 determines whether N (S_s(i))=N (T(i)) is true in step S25.

If N (S_s(i))=N(T(i)) is not true (NO in step S25), the pin-swapping processing part 43 sets i+1 equal to j in step S26. In step S27, the pin-swapping processing part 43 determines whether j>S is true. If j>S is not true (NO in step S27), the pin-swapping processing part 43 determines whether N (S_s(j))=N (T(i)) is true in step S28.

If N (S_s(j))=N(T(i)) is not true (NO in step S28), the pin-swapping processing part 43 adds 1 to j in step S29, and subsequently carries out the process of step S27. The processes in steps S26 to S29 correspond to one pin-swapping step in which a pin of one component is swapped with another one such that the net number (leftmost encircled numerical array in FIG. 11) of the pin of the component matches the net number (rightmost encircled numerical array in FIG. 11) of the counterpart pin of the other component.

If N(S_s(j))=N(T(i)) is true (YES in step S28), the pin-swapping processing part 43 swaps a S_s (i) pin with a S_s(j) pin in step S30, and subsequently carries out the process of step S25. If N(S_s(i))=N(T(i)) is true (YES in step S25), the pin-swapping processing part 43 adds N(S_s(i)) to F in step S31, and subsequently carries out the process of step S22.

In step S24, if i>S is true (YES in step 24), the pin-swapping processing part 43 determines that the pin-swapping has resulted in failure in step S32. In step S27, if j>S is true (YES in step S27), the pin-swapping processing part 43 determines that the pin-swapping has resulted in failure in step S32. In step S22, if the number of elements of F equals S (YES in step 22), the pin-swapping processing part 43 determines that the pin-swapping has resulted in success in step S33.

Figure 22:
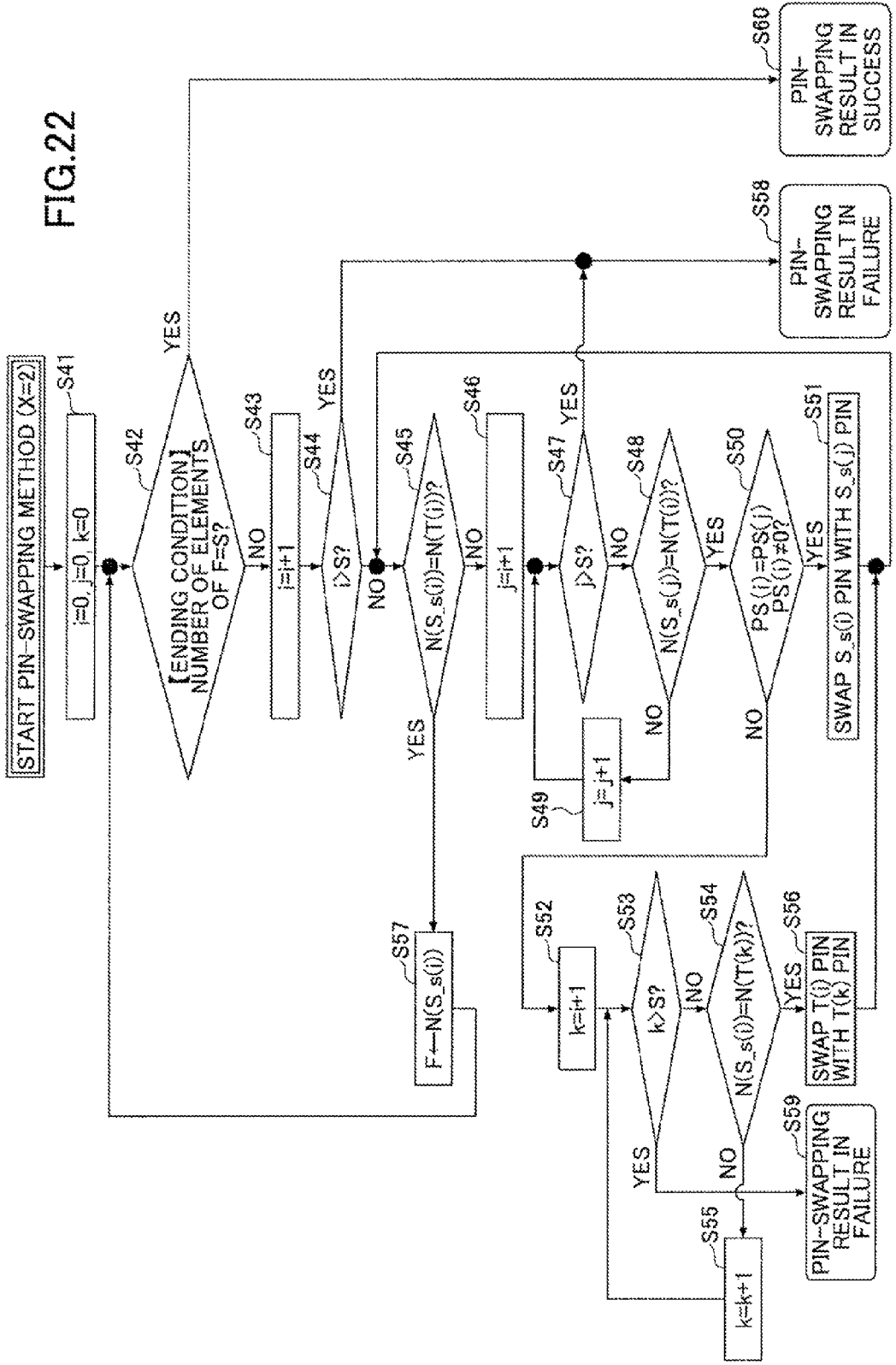
FIG. 22 is a flowchart illustrating an example of a process of the pin-swapping method (X) where a parameter (X) is 2.

FIG. 22 is a flowchart illustrating an example of a process of the pin-swapping method (X) where a parameter (X) is 2. In the flowchart of FIG. 22, definitions of notations S_s, S, S_(i), T(i), N(e) and F are the same as those given in FIG. 22. In addition, PS(i) represents a pin-swapping group number of S_s(i). PT(i) represents a pin-swapping group number of T(i).

In step S41, the pin-swapping processing part 43 sets i=0 j=0 and k=0. In step S42, the pin-swapping processing part 43 determines whether the number of elements of the net group F equals as an ending condition.

If the number of elements of the net group F does not equal S (NO in step S42), the pin-swapping processing part 43 adds 1 to i in step S43. In step S44, the pin-swapping processing part 43 determines whether i>S is true. If i>S is not true (NO in step S44), the pin-swapping processing part 43 determines whether N (S_s (i))=N (T(i)) is true in step S45.

If N (S_s(i))=N (T(i)) is not true (NO in step S45), the pin-swapping processing part 43 sets i+1 equal to j in step S46. In step S47, the pin-swapping processing part 43 determines whether j>S is true. If j>S is not true (NO in step S47), the pin-swapping processing part 43 determines whether N (S_s(j))=N (T(i)) is true in step S48.

If N (S_s(j))=N(T(i)) is not true (NO in step S48), the pin-swapping processing part 43 adds 1 to j in step S49, and subsequently carries out the process of step S47. The processes in steps S46 to S49 correspond to one pin-swapping step in which a pin of one component is swapped with another one such that the net number (leftmost encircled numerical array in FIG. 12) of the pin of the component matches the net number (rightmost encircled numerical array in FIG. 12) of the counterpart pin of the other component.

If N(S_s(j))=N(T(i)) is true (YES in step S48), the pin-swapping processing part 43 determines whether PS(i)=PS and PS(i)≉0 is true in step S50. If PS(i)=PS and PS(i)≉0 is true (YES in step S50), the pin-swapping processing part 43 swaps a S_s(i) pin with a S_s(j) pin in step S51, and subsequently carries out the process of step S45. If N(S_s(i))=N(T (i)) is true (YES in step S45), the pin-swapping processing part 43 adds N (S_s (i)) to F in step S57, and subsequently carries out the process of step S42.

If PS(i)=PS and PS(i)≉0 is not true (YES in step S50), the pin-swapping processing part 43 sets i+1 equal to k in step S52. In step S53, the pin-swapping processing part 43 determines whether k>S is true. If k>S is not true (NO in step S53), the pin-swapping processing part 43 determines whether N (S_s(i))=N (T(k)) is true in step S54.

If N (S_s(i))=N(T(k)) is not true (NO in step S54), the pin-swapping processing part 43 adds 1 to k in step S55, and subsequently carries out the process of step S53. The processes in steps S52 to S55 correspond to one pin-swapping step in which a counterpart pin of the other component is swapped with another one such that the net number (rightmost encircled numerical array in FIG. 12) of the counterpart pin of the other component matches the net number (lefttmost encircled numerical array in FIG. 12) of the pin of the component.

If N(S_s(i))=N(T(k)) is true (YES in step S54), the pin-swapping processing part 43 swaps a T(i) pin with a T(k) pin in step S56, and subsequently carries out the process of step S45. If N(S_s(i))=N(T(i)) is true (YES in step S45), the pin-swapping processing part 43 adds N(S_s(i)) to F in step S57, and subsequently carries out the process of step S42.

In step S44, if i>S is true (YES in step 44), the pin-swapping processing part 43 determines that the pin-swapping has resulted in failure in step S58. In step S47, if j>S is true (YES in step 47), the pin-swapping processing part 43 determines that the pin-swapping has resulted in failure in step S58. In step S53, if k>S is true (YES in step S3), the pin-swapping processing part 43 determines that the pin-swapping has resulted in failure in step S59. In step S42, if the number of elements of F equals S (YES in step 42), the pin-swapping processing part 43 determines that the pin-swapping has resulted in success in step S60.

Figure 23:
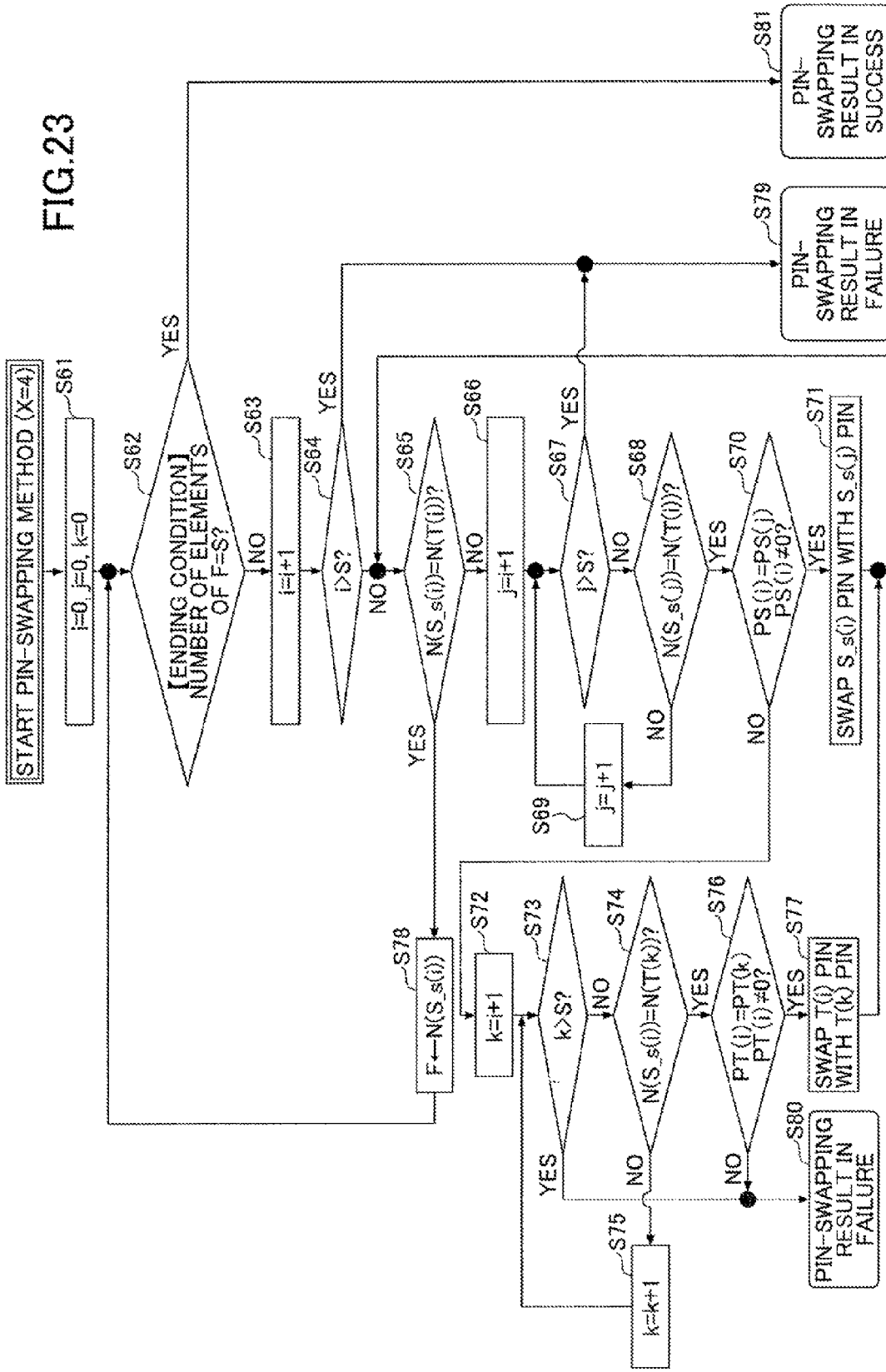
FIG. 23 is a flowchart illustrating an example of a process of the pin-swapping method (X) where a parameter (X) is 4.

FIG. 23 is a flowchart illustrating an example of a process of the pin-swapping method (X) where a parameter (X) is 4. Note that in FIG. 23, since most elements in the flowchart are identical to those illustrated in FIG. 22, descriptions of the elements identical to those illustrated in FIG. 22 are appropriately omitted. Note that processes of steps S61 through S75 illustrated in FIG. 23 are similar to those of steps S41 through S55 illustrated in FIG. 22.

In step S74, if N(S_s(i))=N(T(k)) is true (YES in step S74), the pin-swapping processing part 43 determines whether PT (i)=PT (k) and PS(i)≈0 is true in step S76.

If PT (i)=PT (k) and PT(i)≈0 is true (YES in step S76), the pin-swapping processing part 43 swaps a T(i) pin with a T(k) pin in step S77, and subsequently carries out the process of step S65. If N (S_s(i))=N (T(i)) is true (YES in step S65), the pin-swapping processing part 43 adds N(S_s(i)) to F in step S78, and subsequently carries out the process of step S62.

In step S76, if PT (i)=PT (k) and PT(i)≈0 is not true (YES in step S76), the pin-swapping processing part 43 determines that the pin-swapping has resulted in failure in step S80.

Figure 24A:
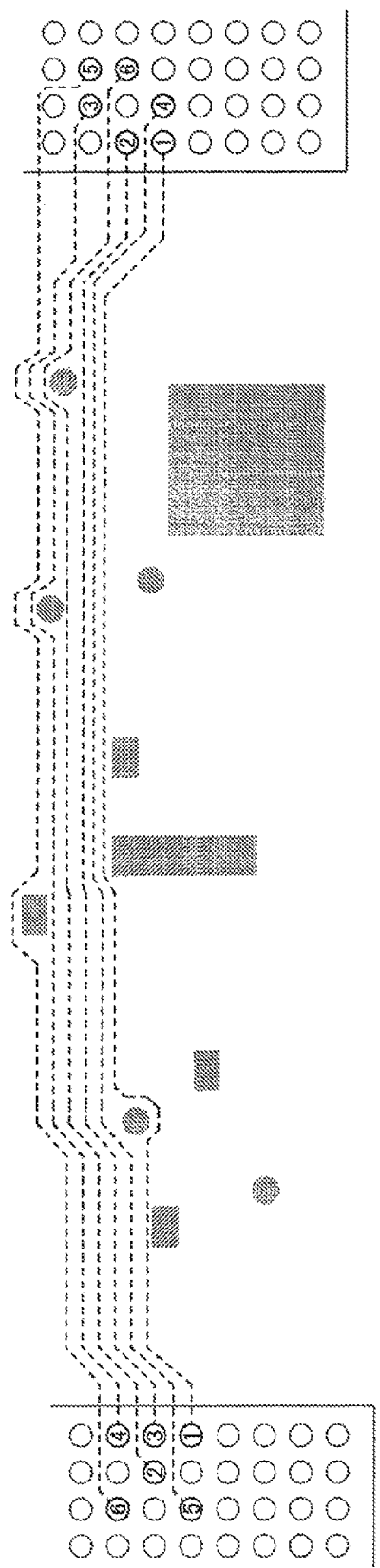
FIGS. 24A and 24B are conceptual diagrams (1/2) illustrating an example of the process carried out by the routing processing part in the design apparatus according to the embodiment.

FIGS. 24A and 24B and FIGS. 25A and 25B are conceptual diagrams illustrating an example of the process carried out by the routing processing part 34 in the design apparatus according to the embodiment. FIG. 24A illustrates an example of a process performed in step S6 in which the source pins and the target pins are virtually wire-connected based on the component pin information in the source pin group and the target pin group by utilizing the single-layer wire routing method such as the max-flow algorithm.

Figure 24B:
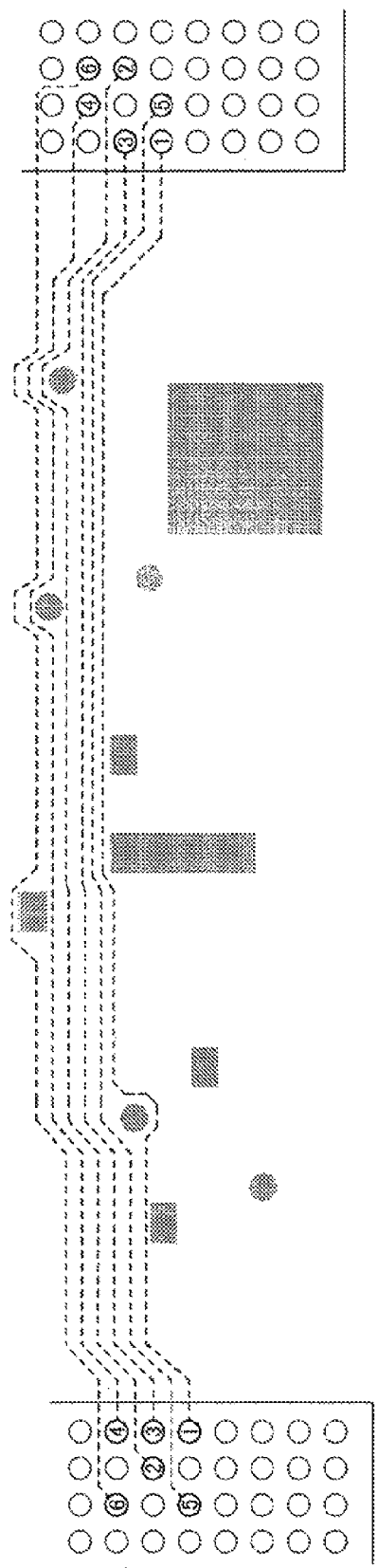

FIG. 24B illustrates an example of a process performed in step S7 in which the pin-swapping method (X) is executed. FIG. 25A illustrates an example of a process performed in step S8 in which the virtually routed wires are deleted. FIG. 25B illustrates an example of a process performed in step S9 in which the virtually wire-connected source pins and target pins are wire-connected precisely.

In the processes in FIGS. 24A and 24B and FIGS. 25A and 25B that are performed by the routing processing part 34 in the design apparatus according to the embodiment, it may be easy to precisely wire-connect the virtually wire-connected source pins and the target pins arranged at intervals between different net groups, because the order of net numbers of the source pins matches the order of the counterpart net numbers of the target pins. Thus, the processes may be automatically performed by the routing processing part 34 as a pin-swapping automatic routing function by coordinating a precise wire-connecting process and a single-layer automatic matching wire-routing process.

Figure 26A:
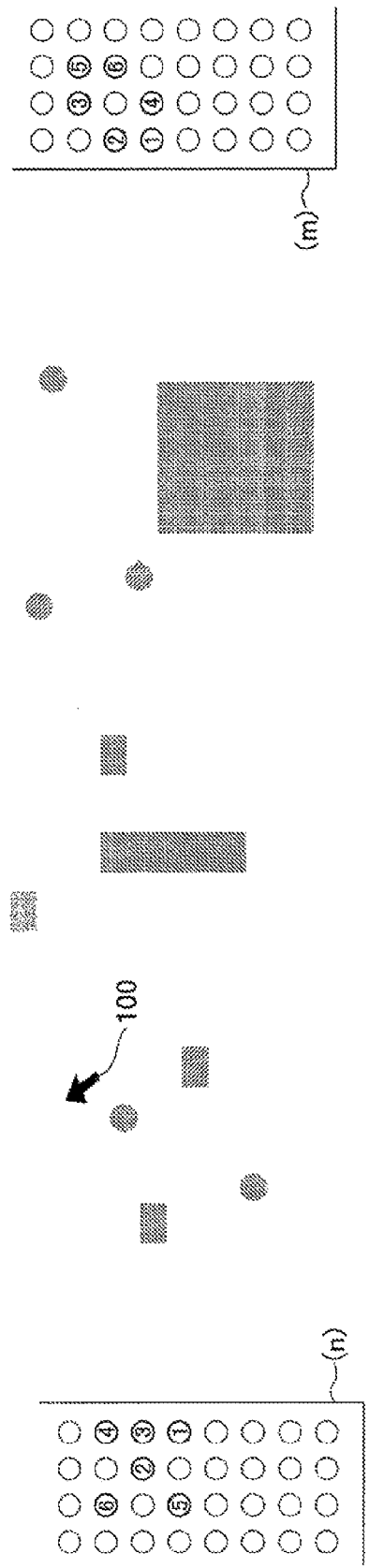
FIGS. 26A and 26B are conceptual diagrams (1/3) illustrating an applied example of the process carried out by the routing processing part in the design apparatus according to the embodiment.

FIG. 26A through FIG. 28B are conceptual diagrams illustrating applied examples of the process carried out by the routing processing part 34 in the design apparatus according to the embodiment. FIG. 26A illustrates a process regarding a bundle of wires connected from a component (n) to a component (m) in which wires are connected by designating a mouse-curser point 100 as a relay point 101 when the pins to be connected of the component (m) are swappable pins. Note that the relay point 101 indicates a line formed of the permutation points corresponding to the number of nets subject to wire routing that is considered to be a virtual connected point.

Figure 26B:
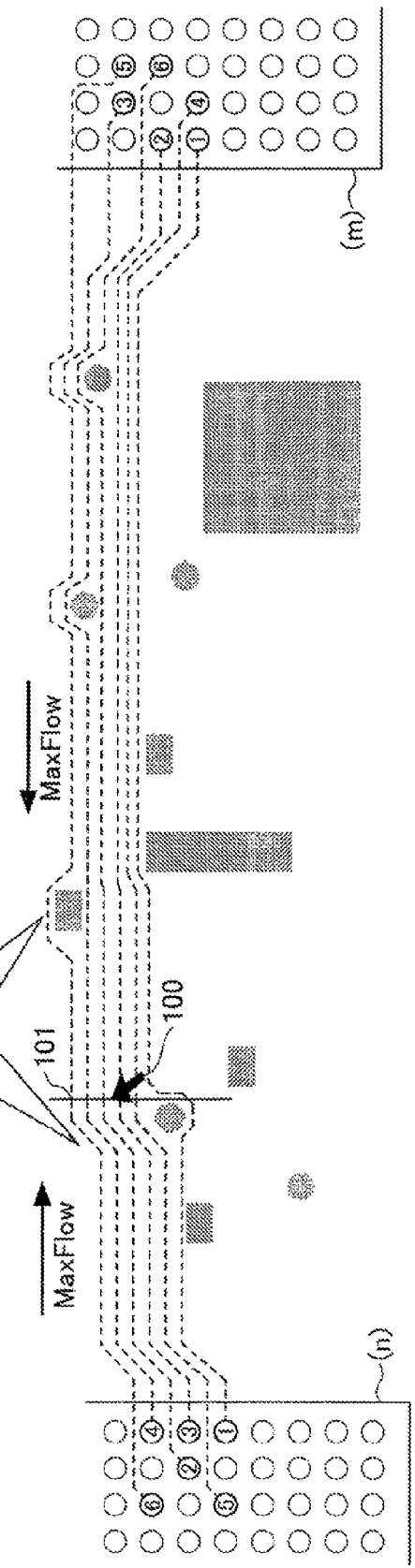

FIG. 26B illustrates a process in which a virtually wire-connecting process from the component (n) to the relay point 101 and a virtually wire-connecting process from the relay point 101 to the component (m) are separately defined. As illustrated in FIG. 26B, the virtually wire-connecting process from the component (n) to the relay point 101 and the virtually wire-connecting process from the relay point 101 to the component (m) may both, for example, utilize the max-flow algorithm.

FIG. 27A illustrates a process in which when a net of the pin of the component (n) and a net of the pin of the component (m) are unmatched at the relay point 101, one of the pins of the component (n) and the component (m) is swapped with an appropriate one such that the net of the pin of the component (n) and the net of the pin of the component (m) are matched, and actual routing of the wires from the component (n) to the relay point 101 is defined by carrying out a precise wire-connecting process to precisely wire-connect the pins having matched nets from the component (n) to the relay point 101.

FIG. 27B illustrates a process in which a relay point 102 is designated by replacing the bundle of the wires from the relay point 101 to the component (m). FIG. 28A illustrates a process in which when a net of the pin of the component (n) and a net of the pin of the component (m) are unmatched at the relay point 102, one of the pins of the component (n) and the component (m) is swapped with an appropriate one such that the net of the pin of the component (n) and the net of the pin of the component (m) are matched, and actual routing of the wires from the component (n) to the relay point 102 is defined by carrying out a precise wire-connecting process to precisely wire-connect the pins having matched nets from the component (n) to the relay point 102. FIG. 28B illustrates a process in which actual routing of all the wires from the final relay point 102 to the component (m) is defined by carrying out a precise wire-connecting process to precisely wire-connect the pins having matched nets from the final relay point 102 to the component (m).

In the design apparatus according to the above embodiment, the swappable pins may be allocated while securing the implementation of the actual wire-routing of the pins.

Note that any arbitrary combinations, expressions, or rearrangement, as appropriate, of the aforementioned constituting elements and so forth applied to a method, device, system, computer program, recording medium, and the like are all effective as and encompassed by the embodiment and modifications.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority or inferiority of the invention. Although the embodiment of the present invention have been described in detail, it should be understood that the various changes, substitutions, and alterations could be made hereto without departing from the spirit and scope of the invention.

What is claimed is:

1. A non-transitory computer-readable recording medium having stored therein a program for causing a computer to execute a process, the process comprising:

virtually routing, when designing routing of a wire to be connected between a first component and a second component at least one of which includes a swappable pin, the wire to be connected between a first pin of the first component and a first counterpart pin of the second component such that implementation of an actual routed wire connected therebetween is secured regardless of a net allocated to the swappable pin; and swapping one of the virtually routed first pin and the virtually routed first counterpart pin with the swappable pin such that the net allocated to the swappable pin is identical to a net allocated to the other one of the virtually routed first pin and the virtually routed first counterpart pin.

2. The non-transitory computer-readable recording medium as claimed in claim 1, wherein the swapping includes correcting a result of the swapping of the one of the virtually routed first pin and the virtually routed first counterpart pin with the swappable pin based on a type of a signal flowing in the net allocated to the swappable pin.

3. The non-transitory computer-readable recording medium as claimed in claim 1, wherein the swapping includes
when the first component and the second component include respective first and second swappable pins, swapping one of the virtually routed first pin of the first component and the virtually routed first counterpart pin of the second component with a corresponding one of the first and second swappable pins, or both of the virtually routed first pin of the first component and the virtually routed first counterpart pin of the second component with the respective first and second swappable pins.

4. The non-transitory computer-readable recording medium as claimed in claim 1, wherein the swapping includes
when a first net group includes the virtually routed first pin of the first component and the virtually routed first counterpart pin of the second component, and a signal applied to the first net group is applied to a second net group, swapping the one of the virtually routed first pin and the virtually routed first counterpart pin with the swappable pin such that the net allocated to the swappable pin is identical to the net allocated to the other one of the virtually routed first pin and the virtually routed first counterpart pin, and swapping a virtually routed pin in the second net group connected to the swappable pin in the first net group with a selected swappable pin in the second net group such that a net allocated to the selected swappable pin in the second net group is identical to the net allocated to the swappable pin in the first net group in coordination with the swapping of the one of the virtually routed first pin and the virtually routed first counterpart pin with the swappable pin in the first group.

5. The non-transitory computer-readable recording medium as claimed in claim 1, wherein the swapping includes
when one of the first component and the second component includes a swappable pin, swapping a corresponding one of the virtually routed first pin of the first component and the virtually routed first counterpart pin of the second component with the swappable pin such that the net allocated to the swappable pin is identical to a net allocated to the other one of the virtually routed first pin of the first component and the virtually routed first counterpart pin of the second component.

6. The non-transitory computer-readable recording medium as claimed in claim 1, wherein the swapping includes
when the first component and the second component include one of first and second swappable pins, and one of the first component and the second component includes a non-swappable pin, swapping one of the virtually routed first pin of the first component and the virtually routed first counterpart pin of the second component with the first swappable pin such that a net allocated to the first swappable pin is identical to the net allocated to the other one of the virtually routed first pin of the first component and the virtually routed first counterpart pin of the second component, and swapping the other one of the virtually routed first pin of the first component and the virtually routed first counterpart pin of the second component with the second swappable pin such that the net allocated to the second swappable pin is identical to a net allocated to the non-swappable pin of the one of the first component and the second component.

7. The non-transitory computer-readable recording medium as claimed in claim 1, wherein the swapping includes
when the first component and the second component include respective swappable pins and respective non-swappable pins, excluding nets allocated to the non-swappable pins of the first component and the second component.

8. The non-transitory computer-readable recording medium as claimed in claim 1, wherein
each of the first component and the second component includes a plurality of pin-swapping groups of swappable pins, and
the process comprises:
when the virtually routed first pin and the swappable pin of the first component are associated with the same pin-swapping group and a net allocated to the swappable pin of the first component is identical to the net allocated to the virtually routed first counterpart pin of the second component, swapping the virtually routed first pin with the swappable pin of the first component such that the net allocated to the swappable pin of the first component is identical to the net allocated to virtually routed first counterpart pin of the second component, and
when the virtually routed first pin and the swappable pin of the first component are associated with the different pin-swapping groups, and a net allocated to the swappable pin of the second component is identical to the net allocated to the virtually routed first pin of the first component, swapping the virtually routed first counterpart pin with the swappable pin of the second component such that the net allocated to the swappable pin of the second component is identical to the net allocated to the virtually routed first pin of the first component.

9. The non-transitory computer-readable recording medium as claimed in claim 1, wherein the virtually routing is based on an algorithm to provisionally route a virtual routed wire so that the actual routed wire corresponding to the virtual routed wire satisfies physical or electric restrictions.

10. A design apparatus comprising:
a first processing unit configured to virtually route, when designing routing of a wire to be connected between a first component and a second component at least one of which includes a swappable pin, the wire to be connected between a first pin of the first component and a first counterpart pin of the second component such that implementation of an actual routed wire connected therebetween is secured regardless of a net allocated to the swappable pin; and
a second processing unit configured to swap one of the virtually routed first pin and the virtually routed first counterpart pin with the swappable pin such that the net allocated to the swappable pin is identical to a net allocated to the other one of the virtually routed first pin and the virtually routed first counterpart pin.

11. The design apparatus as claimed in claim 10, wherein the second processing unit corrects a result of the swapping of the one of the virtually routed first pin and the virtually routed first counterpart pin with the swappable pin based on a type of a signal flowing in the net allocated to the swappable pin.

12. The design apparatus as claimed in claim 10, wherein when the first component and the second component include respective first and second swappable pins, the second processing unit swaps one of the virtually routed first pin of the first component and the virtually routed first counterpart pin of the second component with a corresponding one of the first and second swappable pins, or swaps both of the virtually routed first pin of the first component and the virtually routed first counterpart pin of the second component with the respective first and second swappable pins.

13. The design apparatus as claimed in claim 10, wherein when a first net group includes the virtually routed first pin of the first component and the virtually routed first counterpart pin of the second component, and a signal applied to the first net group is applied to a second net group, swapping the one of the virtually routed first pin and the virtually routed first counterpart pin with the swappable pin such that the net allocated to the swappable pin is identical to the net allocated to the other one of the virtually routed first pin and the virtually routed first counterpart pin, and swapping a virtually routed pin in the second net group connected to the swappable pin in the first net group with a selected swappable pin in the second net group such that a net allocated to the selected swappable pin in the second net group is identical to the net allocated to the swappable pin in the first net group in coordination with the swapping of the one of the virtually routed first pin and the virtually routed first counterpart pin with the swappable pin in the first group.

14. The design apparatus as claimed in claim 10, wherein the first processing unit virtually routes based on an algorithm to provisionally route a virtual routed wire so that the actual routed wire corresponding to the virtual routed wire satisfies physical or electric restrictions.

15. A design method to be implemented in a computer, comprising:

virtually routing, by the computer, when designing routing of a wire to be connected between a first component and a second component at least one of which includes a swappable pin, the wire to be connected between a first pin of the first component and a first counterpart pin of the second component such that implementation of an actual routed wire connected therebetween is secured regardless of a net allocated to the swappable pin; and swapping, by the computer, one of the virtually routed first pin and the virtually routed first counterpart pin with the swappable pin such that the net allocated to the swappable pin is identical to a net allocated to the other one of the virtually routed first pin and the virtually routed first counterpart pin.

16. The design method as claimed in claim 15, wherein the swapping includes correcting a result of the swapping of the one of the virtually routed first pin and the virtually routed first counterpart pin with the swappable pin based on a type of a signal flowing in the net allocated to the swappable pin.

17. The design method as claimed in claim 15, wherein the swapping includes when the first component and the second component include respective first and second swappable pins, swapping one of the virtually routed first pin of the first component and the virtually routed first counterpart pin of the second component with a corresponding one of the first and second swappable pins, or both of the virtually routed first pin of the first component and the virtually routed first counterpart pin of the second component with the respective first and second swappable pins.

18. The design method as claimed in claim 15, wherein the swapping includes when a first net group includes the virtually routed first pin of the first component and the virtually routed first counterpart pin of the second component, and a signal applied to the first net group is applied to a second net group, swapping the one of the virtually routed first pin and the virtually routed first counterpart pin with the swappable pin such that the net allocated to the swappable pin is identical to the net allocated to the other one of the virtually routed first pin and the virtually routed first counterpart pin, and swapping a virtually routed pin in the second net group connected to the swappable pin in the first net group with a selected swappable pin in the second net group such that a net allocated to the selected swappable pin in the second net group is identical to the net allocated to the swappable pin in the first net group in coordination with the swapping of the one of the virtually routed first pin and the virtually routed first counterpart pin with the swappable pin in the first group.

19. The design method as claimed in claim 15, wherein the virtually routing is based on an algorithm to provisionally route a virtual routed wire so that the actual routed wire corresponding to the virtual routed wire satisfies physical or electric restrictions.

* * * * *